12) United States Patent
Haba et al.

(10) Patent No.: US 8,058,101 B2
(45) Date of Patent: Nov. 15, 2011

(54) MICROELECTRONIC PACKAGES AND METHODS THEREFOR

(75) Inventors: Belgacem Haba, Saratoga, CA (US); Teck-Gyu Kang, San Jose, CA (US); Ilyas Mohammed, Santa Clara, CA (US); Ellis Chau, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 685 days.

(21) Appl. No.: 11/318,404

(22) Filed: Dec. 23, 2005

(65) Prior Publication Data
US 2007/0148822 A1 Jun. 28, 2007

(51) Int. Cl.
*H01L 21/00* (2006.01)

(52) U.S. Cl. ........ 438/109; 438/110; 438/112; 257/678; 257/686; 257/E21.499

(58) Field of Classification Search .......... 438/106–127; 257/678, 686, E21.499
See application file for complete search history.

(56) References Cited

U.S. PATENT DOCUMENTS

| | | |
|---|---|---|
| 3,900,153 A | 8/1975 | Beerwerth et al. |
| 4,695,870 A | 9/1987 | Patraw |
| 4,716,049 A | 12/1987 | Patraw |
| 4,804,132 A | 2/1989 | Difrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,222,014 A * | 6/1993 | Lin ............... 361/792 |
| 5,340,771 A | 8/1994 | Rostoker |

(Continued)

FOREIGN PATENT DOCUMENTS

EP 920058 6/1999

(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Khiem D Nguyen
(74) *Attorney, Agent, or Firm* — Lerner, David, Littenberg, Krumholz & Mentlik, LLP

(57) ABSTRACT

A method of making a microelectronic assembly includes providing a microelectronic package having a substrate, a microelectronic element overlying the substrate and at least two conductive elements projecting from a surface of the substrate, the at least two conductive elements having surfaces remote from the surface of the substrate. The method includes compressing the at least two conductive elements so that the remote surfaces thereof lie in a common plane, and after the compressing step, providing an encapsulant material around the at least two conductive elements for supporting the microelectronic package and so that the remote surfaces of the at least two conductive elements remain accessible at an exterior surface of the encapsulant material.

16 Claims, 15 Drawing Sheets

U.S. PATENT DOCUMENTS

| | | | |
|---|---|---|---|
| 5,397,997 A | 3/1995 | Tuckerman et al. | |
| 5,455,390 A | 10/1995 | DiStefano et al. | |
| 5,518,964 A | 5/1996 | DiStefano et al. | |
| 5,615,824 A | 4/1997 | Fjelstad et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,731,709 A | 3/1998 | Pastore et al. | |
| 5,736,780 A | 4/1998 | Murayama | |
| 5,802,699 A | 9/1998 | Fjelstad et al. | |
| 5,811,982 A | 9/1998 | Beaman et al. | |
| 5,854,507 A | 12/1998 | Miremadi et al. | |
| 5,912,505 A | 6/1999 | Itoh et al. | |
| 5,971,253 A | 10/1999 | Gilleo et al. | |
| 5,973,391 A | 10/1999 | Bischoff et al. | |
| 5,980,270 A | 11/1999 | Fjelstad et al. | |
| 6,032,359 A | 3/2000 | Carroll | |
| 6,038,136 A | 3/2000 | Weber | |
| 6,052,287 A | 4/2000 | Palmer et al. | |
| 6,054,756 A | 4/2000 | DiStefano et al. | |
| 6,077,380 A | 6/2000 | Hayes et al. | |
| 6,124,546 A | 9/2000 | Hayward et al. | |
| 6,177,636 B1 | 1/2001 | Fjelstad | |
| 6,194,250 B1 * | 2/2001 | Melton et al. | 438/126 |
| 6,202,297 B1 | 3/2001 | Faraci et al. | |
| 6,258,625 B1 | 7/2001 | Brofman et al. | |
| 6,332,270 B2 | 12/2001 | Beaman et al. | |
| 6,358,627 B2 | 3/2002 | Benenati et al. | |
| 6,362,525 B1 | 3/2002 | Rahim | |
| 6,458,411 B1 | 10/2002 | Goossen et al. | |
| 6,495,914 B1 | 12/2002 | Sekine et al. | |
| 6,507,104 B2 * | 1/2003 | Ho et al. | 257/712 |
| 6,514,847 B1 | 2/2003 | Ohsawa et al. | |
| 6,515,355 B1 | 2/2003 | Jiang et al. | |
| 6,522,018 B1 | 2/2003 | Tay et al. | |
| 6,545,228 B2 * | 4/2003 | Hashimoto | 174/260 |
| 6,550,666 B2 | 4/2003 | Chew et al. | |
| 6,555,918 B2 | 4/2003 | Masuda et al. | |
| 6,560,117 B2 | 5/2003 | Moon | |
| 6,573,458 B1 | 6/2003 | Matsubara et al. | |
| 6,578,754 B1 | 6/2003 | Tung | |
| 6,624,653 B1 | 9/2003 | Cram | |
| 6,647,310 B1 | 11/2003 | Yi et al. | |
| 6,902,869 B2 | 6/2005 | Appelt et al. | |
| 6,930,256 B1 | 8/2005 | Huemoeller et al. | |
| 6,987,032 B1 * | 1/2006 | Fan et al. | 438/122 |
| 7,045,884 B2 | 5/2006 | Standing | |
| 7,067,911 B1 | 6/2006 | Lin et al. | |
| 7,176,559 B2 | 2/2007 | Ho et al. | |
| 7,185,426 B1 | 3/2007 | Hiner et al. | |
| 7,215,033 B2 | 5/2007 | Lee et al. | |
| 7,233,057 B2 | 6/2007 | Hussa | |
| 7,323,767 B2 * | 1/2008 | James et al. | 257/678 |
| 7,372,151 B1 * | 5/2008 | Fan et al. | 257/738 |
| 7,485,562 B2 | 2/2009 | Chua et al. | |
| 7,633,765 B1 | 12/2009 | Scanlan et al. | |
| 7,671,457 B1 | 3/2010 | Hiner et al. | |
| 7,671,459 B2 | 3/2010 | Corisis et al. | |
| 7,675,152 B2 | 3/2010 | Gerber et al. | |
| 2002/0125571 A1 | 9/2002 | Corisis et al. | |
| 2002/0153602 A1 | 10/2002 | Tay et al. | |
| 2003/0057544 A1 | 3/2003 | Nathan et al. | |
| 2003/0124767 A1 | 7/2003 | Lee et al. | |
| 2003/0164540 A1 * | 9/2003 | Lee et al. | 257/686 |
| 2004/0036164 A1 | 2/2004 | Koike et al. | |
| 2004/0038447 A1 | 2/2004 | Corisis et al. | |
| 2004/0075164 A1 | 4/2004 | Pu et al. | |
| 2004/0090756 A1 | 5/2004 | Ho et al. | |
| 2004/0110319 A1 | 6/2004 | Fukutomi et al. | |
| 2004/0160751 A1 | 8/2004 | Inagaki et al. | |
| 2004/0262734 A1 | 12/2004 | Yoo | |
| 2005/0035440 A1 | 2/2005 | Mohammed | |
| 2005/0082664 A1 | 4/2005 | Funaba et al. | |
| 2005/0116326 A1 | 6/2005 | Haba et al. | |
| 2005/0173805 A1 | 8/2005 | Damberg et al. | |
| 2005/0181544 A1 | 8/2005 | Haba et al. | |
| 2005/0181655 A1 | 8/2005 | Haba et al. | |
| 2005/0285246 A1 | 12/2005 | Haba et al. | |
| 2007/0148822 A1 | 6/2007 | Haba et al. | |
| 2008/0284045 A1 | 11/2008 | Gerber et al. | |
| 2008/0315385 A1 | 12/2008 | Gerber et al. | |
| 2010/0232129 A1 | 9/2010 | Haba et al. | |

FOREIGN PATENT DOCUMENTS

| | | |
|---|---|---|
| JP | 62-68015 A | 9/1994 |
| JP | 2003122611 A | 4/2003 |
| JP | 2003-174124 | 6/2003 |
| JP | 2003307897 A | 10/2003 |
| JP | 2004327856 A | 11/2004 |
| JP | 2004343030 A | 12/2004 |
| JP | 2003377641 A | 6/2005 |
| JP | 2005142378 A | 6/2005 |
| JP | 2003426392 A | 7/2005 |
| JP | 2005183880 A | 7/2005 |
| WO | 02/13256 | 2/2002 |

OTHER PUBLICATIONS

North Corporation, "Processed Intra-layer Interconnection Material for PWBs [Etched Copper Bump with Copper Foil]," NMBI™, Version 2001.6.

Kim et al., "Application of Through Mold Via (TMV) as PoP base package", 6 pages (2008).

International Search Report, PCT/US2005/039716, Apr. 5, 2006.

JP Pub. 2004-327856 "Method for manufacturing wiring circuit board and method for manufacturing semiconductor integrated circuit device using the wiring circuit board", Kimiyoshi et al. (Nov. 18, 2004).

Office Action from U.S. Appl. No. 12/769,930 mailed May 5, 2011.

* cited by examiner

MICROELECTRONIC PACKAGES AND METHODS THEREFOR

FIELD OF THE INVENTION

The present invention relates to microelectronic packages and to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the -package. This is advantageous in that it reduces the overall size of the assembly and permits the use of short interconnections between various devices on the substrate, which in turn limits signal propagation time between devices and thus facilitates operation of the assembly at high speeds. Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices used for high-frequency operation are typically tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing microelectronic packages would be desirable.

SUMMARY OF THE INVENTION

In certain preferred embodiments of the present invention, a method of making a microelectronic assembly includes providing a microelectronic package having a substrate, a microelectronic element overlying the substrate and at least one conductive element projecting from a surface of the substrate, the at least one conductive element having a surface remote from the surface of the substrate. The method desirably includes compressing the at least one conductive element so that the remote surface thereof lies in a common plane, and after the compressing step, providing an encapsulant material around the at least one conductive element for supporting the microelectronic package and so that the remote surfaces of the at least one conductive element remains accessible at an exterior surface of the encapsulant material. In certain preferred embodiments, the at least one conductive element includes at least two conductive elements.

In certain preferred embodiments, the at least two conductive elements project from a first surface of the substrate and the package further comprises at least two second conductive elements projecting from a second surface of the substrate, the at least two second conductive elements having surfaces remote from the second surface of the substrate. The method may also include compressing the at least two second conductive elements so that the remote surfaces of the at least two second conductive elements lie in a common plane.

The substrate may be flexible, and may include a dielectric material such as a polyimide. The microelectronic element is desirably electrically interconnected with the substrate, such as by using conductive leads, wires or traces. The microelectronic element may be a semiconductor chip having a front face with contacts and a back face remote therefrom. In certain preferred embodiments, the front face of the semiconductor chip faces the substrate. In other preferred embodiments, however, the front face of the semiconductor chip faces away from the substrate and the back face of the semiconductor chip faces the substrate. A compliant layer may be disposed between the microelectronic element and the substrate.

In preferred embodiments, the at least two conductive elements are disposed over a top surface of the substrate. In other preferred embodiments, the at least two conductive elements are disposed over a bottom surface of the substrate. The substrate may include a plurality of dielectric layers, and a plurality of layers of conductive traces may extend through the substrate.

The method may include making a second microelectronic package using the steps discussed above, and stacking the second microelectronic package atop the first microelectronic package, the first and second microelectronic packages being electrically interconnected together through the conductive elements.

In another preferred embodiment of the present invention, a method of making a microelectronic assembly includes providing a mold having an internal cavity, placing a microelectronic package into the cavity of the mold, the microelectronic package including a substrate, a microelectronic element overlying the substrate and at least one conductive element projecting from a first surface of the substrate, the at least one conductive element having a surface remote from the first surface of the substrate. The method desirably includes utilizing the mold for compressing the at least one conductive element, and after the compressing step and while the mold remains in contact with the remote surface of the at least one conductive element, introducing an encapsulant material into the cavity of the mold for encapsulating the microelectronic element and surrounding the at least one conductive element. The mold preferably remains in contact with the remote surface of the at least one conductive element during the introducing an encapsulant material step so that the remote surface of the at least one conductive element remains accessible at an exterior surface of the encapsulant material. After the encapsulant material is introduced, it may be cured.

In other preferred embodiments of the present invention, a method of making a microelectronic assembly includes providing a mold having an internal cavity, placing a microelectronic package into the cavity of the mold, the microelectronic package including a substrate, at least one microelectronic element overlying the substrate and at least two vertical conductors projecting from a first surface of the substrate, the at least two vertical conductors having surfaces remote from the first surface of the substrate. The method desirably includes utilizing the mold for compressing the at least two vertical conductors so that the remote surfaces of the two vertical conductors lie in a common plane, and after the compressing step, introducing an encapsulant material into the cavity of the mold for encapsulating the at least one microelectronic element and surrounding the at least two vertical conductors, wherein the mold remains in contact with the remote surfaces of the at least two vertical conductors during the introducing an encapsulant material step so that the remote surfaces of the at least two vertical conductors remain accessible at an exterior surface of the encapsulant material. The vertical conductors may be conductive posts or metallic masses.

In preferred embodiments, the substrate has a central region and peripheral regions adjacent outer edges of the substrate. The at least one microelectronic element desirably overlies the central region of the substrate and the vertical conductors are disposed in the peripheral regions of the substrate. The method may include making a second microelectronic package in accordance with the steps discussed above and stacking the second microelectronic package over the first microelectronic package, with the first and second microelectronic packages being electrically interconnected through the vertical conductors.

One aspect of the invention provides a microelectronic package including a microelectronic element such as a semiconductor chip and a flexible substrate spaced from and overlying a first face of the microelectronic element. The package according to this aspect of the invention desirably includes a plurality of conductive posts extending from the flexible substrate and projecting away from the microelectronic element, with at least some of the conductive posts being electrically interconnected with said microelectronic element. Most preferably, the package according to this aspect of the invention includes a plurality of support elements disposed between the microelectronic element and said substrate and supporting said flexible substrate over the microelectronic element. Desirably, at least some of the conductive posts are offset in horizontal directions parallel to the plane of the flexible substrate from the support elements. For example, the support elements may be disposed in an array with zones of the flexible substrate disposed between adjacent support elements, and the posts may be disposed near the centers of such zones.

The offset between the posts and the support elements allows the posts, and particularly the bases of the posts adjacent the substrate, to move relative to the microelectronic element. Most preferably, the arrangement allows each post to move independently of the other posts. The movement of the posts allows the tips of the plural posts to simultaneously engage contact pads on a circuit board despite irregularities in the circuit board or the package, such as warpage of the circuit board. This facilitates testing of the package using a simple test board, which may have substantially planar contacts, and avoids the need for specialized, expensive test sockets.

Most preferably, the flexible substrate overlies the front or contact-bearing face of the microelectronic element. At least some of the support elements desirably are electrically conductive elements such as solder balls. The conductive support elements may electrically interconnect at least some of the contacts of the microelectronic element with at least some of the conductive posts. In preferred forms, this arrangement can prove low-impedance conductive paths between the posts and the microelectronic element, suitable for high-frequency signal transmission. Most desirably, at least some of the posts are connected to at least some of the contacts on the microelectronic element by conductive support elements immediately adjacent to those posts. Preferably, conductive traces provided on the flexible substrate electrically interconnect at least some of the conductive posts with at least some of the conductive support elements. These traces may be very short; the length of each trace desirably is equal to the offset distance between a single post and a single support element.

A further aspect of the present invention provides a microelectronic assembly, which desirably includes a package as discussed above and a circuit panel having contact pads. Tips of the posts remote from the flexible substrate confront the contact pads and are electrically connected thereto, most preferably by electrically conductive bonding material such as solder. As further discussed below, the assembly can be compact and highly reliable.

A further aspect of the invention provides a microelectronic package, which includes a microelectronic element and a flexible substrate spaced from and overlying said microelectronic element. The flexible substrate is supported above said front face of said microelectronic element so that said substrate is at least partially unconstrained in flexure. For example, the flexible substrate may be supported by support elements as described above, or by other means such as a continuous compliant layer. Here again, the package includes a plurality of conductive posts extending from the flexible substrate and projecting away from the microelectronic element, the conductive posts being electrically connected to the microelectronic element. The conductive posts have bases facing toward the flexible substrate. The package according to this embodiment of the invention desirably includes elements referred to herein as "focusing elements" disposed between the bases of at least some of the posts and the substrate and mechanically interconnecting the bases of the conductive posts with the substrate. The focusing elements desirably have smaller areas than the bases of the posts. As further discussed below, this arrangement facilitates flexing of the substrate and movement of the posts.

Yet another aspect of the invention provides methods of processing microelectronic packages. Method according to this aspect of the invention desirably include the step of advancing a microelectronic package having a flexible substrate supported over a surface of a microelectronic element and having electrically conductive posts projecting from said substrate until tips of said posts engage contact pads on a test circuit panel and the substrate flexes so that at least some base portions of said posts adjacent said flexible substrate move relative to the microelectronic element. In preferred methods according to this aspect of the present invention, movement of the bases of the posts contribute to movement of the tips, allowing the tips to engage contact pads even where the contact pads themselves are not coplanar with one another.

The method according to this aspect of the invention may include the further steps of maintaining the tips of the posts in contact with said contact pads and testing the package during the maintaining step, as by transmitting signals to and from the package through the engaged contact pads and posts. The method may be practiced using a simple circuit panel, with simple contact pads. The method may further include disengaging the tips from the contact pads after testing, and may also include bonding the tips of the posts to electrically conductive elements of a circuit panel after disengagement from the test circuit panel. One aspect of the present invention, a provides a microelectronic package which includes a mounting structure, a microelectronic element associated with the mounting structure, and a plurality of conductive posts physically connected to the mounting structure and electrically connected to the microelectronic element. The conductive posts desirably project from the mounting structure in an upward direction. At least one of the conductive posts may be an offset post. Each offset post preferably has a base connected to the mounting structure, the base of each offset post defining a centroid. As further explained below, where the base has a regular, biaxially symmetrical or point symmetrical shape such as a circle, the centroid is simply the geometric center of the base. Each offset post also desirably defines an upper extremity having a centroid, the centroid of the upper extremity being offset from the centroid of the base in a horizontal offset direction transverse to the upward direction. When the package according to this aspect of the invention is engaged with an external unit such as a test fixture, vertically directed contact forces are applied by the contact pads of the external unit. The contact forces applied to each offset post are centered at the centroid of the upper extremity. The reaction forces applied by the mounting structure to the base of the post are centered at the centroid of the base. Because these centroids are offset from one another, the forces applied to the post tend to tilt it about a horizontal axis. Tilting of the post causes the upper extremity of the post to wipe across the surface of the contact pad, which promotes good contact between the post and the contact pad. The mounting structure desirably is deformable, so that the bases of the posts can move relative to the microelectronic element in the tilting mode discussed above. The mounting structure also may be arranged to deform so as to permit translational movement of the posts in a vertical direction, toward the microelectronic element. The movement of individual posts may differ, so that the tips of numerous posts can be engaged with numerous contact pads even where the tips of the posts are not coplanar with one another, the contact pads are not coplanar with one another, or both, prior to engagement of the posts and contact pads.

The mounting structure may include a flexible substrate, which may have conductive traces formed thereon for electrically interconnecting the posts with a microelectronic element. The flexible substrate may be a generally sheet like substrate extending substantially in a horizontal plane, the substrate having a top surface and a bottom surface, the conductive posts projecting upwardly from the top surface. The flexible substrate may also include a plurality of gaps extending through the substrate and defining a plurality of regions, different ones of the posts being disposed on different ones of the regions such as disclosed in commonly assigned U.S. patent application Ser. No. 10/985,119, entitled "MICRO PIN GRID WITH PIN MOTION ISOLATION," filed on Nov. 10, 2004, the disclosure of which is hereby incorporated herein by reference. The package may incorporate a support layer such as a compliant layer disposed between the flexible substrate and the microelectronic element. In other embodiments, the package may include a plurality of support elements spaced apart from one another and disposed between the flexible substrate and the microelectronic element, the bases of the posts being spaced horizontally from the support elements as described in greater detail in the co-pending, commonly assigned U.S. patent application Ser. No. 11/014,439, entitled "MICROELECTRONIC PACKAGES AND METHODS THEREFOR," filed on Dec. 16, 2004, the disclosure of which is hereby incorporated herein by reference.

The microelectronic element of the package preferably has faces and contacts, the contacts being electrically interconnected with the conductive posts. In certain embodiments, the contacts are exposed at a first face of the microelectronic element and the mounting structure overlies the first face. In other embodiments, the contacts are exposed at a first face of the microelectronic element and the mounting structure overlies a second, oppositely directed face of the microelectronic element.

still further aspect of the invention provides methods of making microelectronic packages and elements of such packages. A method according to this aspect of the invention desirably includes providing a blank made of a conductive material such as copper, applying a fluid under pressure, desirably a liquid, to the blank to form at least one conductive terminal in the blank, and providing electrical interconnections to the at least one conductive terminal. The at least one conductive terminal may be a conductive post. The method may also include heating the blank so as to make the blank more ductile during the forming operation.

The contacts of the microelectronic element are desirably accessible at the first face of the microelectronic element. That is, the flexible substrate overlies the front or contact-bearing face of the microelectronic element. However, the microelectronic element may have a second face opposite the first face and the contacts may be accessible at the second face of the microelectronic element. The microelectronic package may also include conductive elements, such as conductive traces provided on said flexible substrate, for electrically interconnecting said conductive terminals and said microelectronic element.

In certain preferred embodiments of the present invention, an assembly for testing microelectronic devices includes a microelectronic element having faces and contacts, a flexible substrate, such as a dielectric sheet, spaced from and overlying a first face of the microelectronic element, and a plurality of conductive posts extending from the flexible substrate and projecting away from the first face of the microelectronic element. At least some of the conductive posts are desirably electrically interconnected with the microelectronic element. The conductive posts may have a base facing toward the flexible substrate. The assembly may incorporate one or more of the features disclosed in commonly assigned U.S. Provisional Application Ser. No. 60/662,199, entitled "MICROELECTRONIC PACKAGES AND METHODS THEREFOR," filed Mar. 16, 2005 [TESSERA 3.8-429], the disclosure of which is hereby incorporated by reference herein.

The assembly also desirably includes a plurality of support elements disposed between the microelectronic element and the substrate. The support elements desirably support the flexible substrate over the microelectronic element, with at least some of the conductive posts being offset from the support elements. A compliant material may be disposed between the flexible substrate and the microelectronic element.

In certain preferred embodiments, at least one of the conductive support elements includes a mass of a fusible material. In other preferred embodiments, at least one of the conductive support elements includes a dielectric core and an electrically conductive outer coating over the dielectric core. The support element may also be elongated, having a length that is greater than its width or diameter.

The microelectronic element may be a printed circuit board or a test board used to test devices such as microelectronic elements and microelectronic packages. The first face of the microelectronic element may be a front face of the microelectronic element and the contacts may be accessible at the front face. In certain preferred embodiments, at least some of the support elements are electrically conductive. The conductive support elements desirably electrically interconnect at least some of the contacts of the microelectronic element with at least some of the conductive posts. In certain preferred embodiments, the support elements include a plurality of second conductive posts extending from the flexible substrate. The second conductive posts preferably project toward the first face of the microelectronic element, with at least some of the second conductive posts being electrically interconnected with the first conductive posts. In certain preferred embodiments, a first conductive post is electrically interconnected to a contact through a second conductive post disposed immediately adjacent to the first conductive post.

The conductive posts may be elongated, whereby the posts have a length that is substantially greater than the width or diameter of the posts. The support elements may be disposed in an array so that the support elements define a plurality of zones on the flexible substrate, each zone being bounded by a plurality of the support elements defining corners of the zone, with different ones of the conductive posts being disposed in different ones of the zones. In preferred embodiments, only one of the conductive posts is disposed in each of the zones.

In another preferred embodiments of the present invention, a microelectronic assembly includes a microelectronic element having faces and contacts, a flexible substrate spaced from and overlying a first face of the microelectronic element, and a plurality of first conductive posts extending from the flexible substrate and projecting away from the first face of the microelectronic element, at least some of the conductive posts being electrically interconnected with the microelectronic element. The assembly also desirably includes a plurality of second conductive posts extending from the flexible substrate and projecting toward the first face of the microelectronic element, the second conductive posts supporting the flexible substrate over the microelectronic element, at least some of the first conductive posts being offset from the second conductive posts.

In preferred embodiments, at least some of the second conductive posts are electrically conductive, the second conductive posts electrically interconnecting at least some of the contacts of the microelectronic element with at least some of the first conductive posts. At least some of the first conductive posts may be connected to at least some of the contacts by second conductive posts located immediately adjacent to the first conductive posts. The assembly may also include conductive traces provided on the flexible substrate, whereby the conductive traces electrically interconnect at least some of the first conductive posts with at least some of the contacts on the microelectronic element. In certain preferred embodiments, at least one of the conductive traces extends between adjacent conductive posts.

In another preferred embodiment of the present invention, a microelectronic assembly includes a microelectronic element having faces and contacts, and a flexible substrate spaced from and overlying a first face of the microelectronic element, the flexible substrate having conductive traces provided thereon. The assembly also desirably includes a plurality of conductive elements extending between the contacts of the microelectronic element and the conductive traces for spacing the flexible substrate from the microelectronic element and for electrically interconnecting the microelectronic element and the conductive traces. The conductive elements may be elongated, conductive posts. The conductive traces preferably have inner ends connected with the conductive elements and outer ends that extend beyond an outer perimeter of the microelectronic element. The outer ends of the conductive traces are desirably movable relative to the contacts of the microelectronic element. The assembly may also include an encapsulant material disposed between the microelectronic element and the flexible substrate.

In another preferred embodiment of the present invention, a microelectronic assembly desirably includes a circuitized substrate having metalized vias extending from a first surface of the substrate toward a second surface of the substrate. The assembly may also include a microelectronic package having conductive posts projecting therefrom, the conductive posts being at least partially inserted into openings of the metalized vias for electrically interconnecting the microelectronic package and the substrate. The microelectronic package may include a microelectronic element having faces and contacts, a flexible substrate spaced from and overlying a first face of the microelectronic element, and a plurality of support elements extending between the microelectronic element and the flexible substrate for spacing the flexible substrate from the microelectronic element. The conductive posts are preferably electrically interconnected with the contacts of the microelectronic element and are provided on a region of the flexible substrate that is located outside a perimeter of the microelectronic element. The conductive posts are desirably movable relative to the contacts of the microelectronic element.

Assemblies in accordance with preferred embodiments of the present invention facilitate testing of microelectronic elements and packages having non-planar contacts and interfaces, and avoids the need for specialized, expensive test equipment. In preferred methods according to this aspect of the present invention, movement of the bases of the conductive posts contribute to movement of the tips of the posts, allowing the tips to engage opposing contact pads even where the contact pads themselves are not coplanar with one another.

As noted above, conductive traces may be provided on a flexible substrate for electrically interconnecting at least some of the first conductive posts with at least some of the second conductive posts. These traces may be very short; the length of each trace desirably is equal to the offset distance between a first conductive post and a second conductive post. In preferred forms, this arrangement can prove low-impedance conductive paths between the posts and the microelectronic element, suitable for high-frequency signal transmission.

In another preferred embodiment of the present invention, a microelectronic assembly includes a bare chip or wafer having contacts on a front face thereof. The bare chip or wafer is juxtaposed with a flexible substrate having conductive posts on a top surface thereof and conductive terminals on a bottom surface thereof. At least some of the conductive posts are not aligned with some of the conductive terminals. The conductive posts are preferably interconnected with the conductive terminals. During assembly, the tip ends of the conductive post are abutted against the contacts of the chip or wafer for electrically interconnecting the chip or wafer with the conductive terminals on the flexible substrate. An encapsulant may be provided between the chip/wafer and the flexible substrate. Conductive elements such as solder balls may be provided in contact with the conductive terminals. The misalignment of the conductive terminals with the conductive posts provides compliancy to the package and enables the conductive terminals to move relative to the chip/wafer. In certain preferred embodiments, the conductive posts have an outer layer of gold that is pressed directly against the chip contacts. In other preferred embodiments, the electrical interconnection between the conductive posts and the contacts is formed using an anisotropic conductive film or an anisotropic conductive paste, whereby the conductive particles are disposed between the conductive posts and the contacts. In another preferred embodiment of the present invention, the encapsulant for holding the chip/wafer and the flexible substrate together includes a non-conductive film or paste.

These and other preferred embodiments of the present invention will be described in more detail below.

DETAILED DESCRIPTION OF PREFERRED EMBODIMENTS

Figure 1:
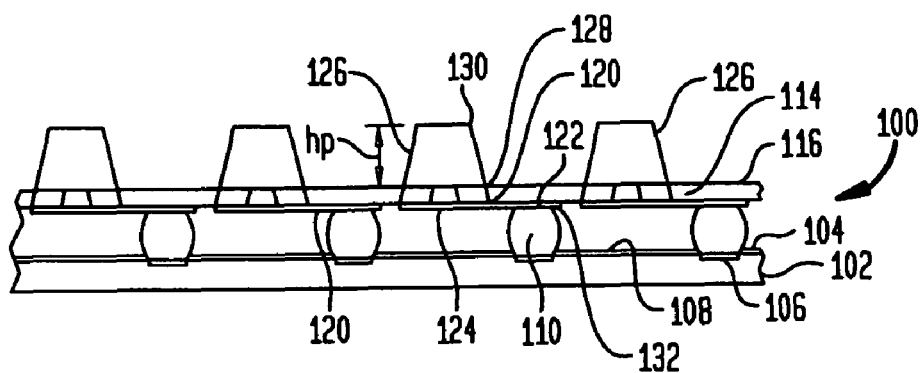
FIG. 1 is a diagrammatic sectional view of a package according to one embodiment of the invention.

Referring to FIG. 1, in accordance with one preferred embodiment of the present invention, a microelectronic package 100 includes a microelectronic element, such as a semiconductor chip 102, having a front or contact bearing face 104 and electrical contacts 106 exposed at face 104. A passivation layer 108 may be formed over the contact bearing face 104 with openings at contacts 106.

Figure 2:
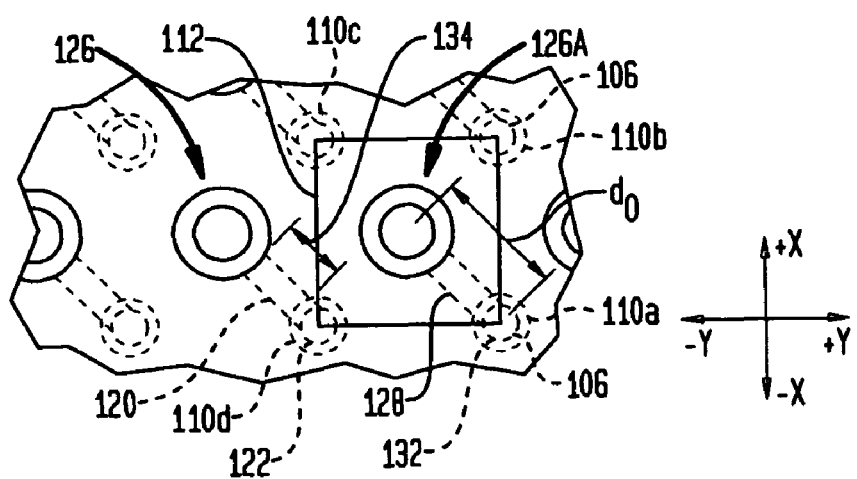
FIG. 2 is a fragmentary plan view of the package shown in FIG. 1.

The microelectronic package 100 also includes conductive support elements 110 such as solder balls in substantial alignment and electrically interconnected with contacts 106. As best seen in FIG. 2, contacts 106 and support elements 110 are disposed in an array which in this case is a rectilinear grid, having equally spaced columns extending in a first horizontal direction x and equally spaced rows extending in a second horizontal direction y orthogonal to the first horizontal direction. Each contact 106 and support element 110 is disposed at an intersection of a row and a column, so that each set of four support elements 110 at adjacent intersections, such as support elements 110a, 110b, 110c and 110d, defines a generally rectangular, and preferably square, zone 112. The directions referred to in this disclosure are directions in the frame of reference of the components themselves, rather than in the normal gravitational frame of reference. Horizontal directions are directions parallel to the plane of the front surface 104 of the chip, whereas vertical directions are perpendicular to that plane.

The package also includes a flexible dielectric substrate 114, such as a polyimide or other polymeric sheet, including a top surface 116 and a bottom surface 118 remote therefrom. Although the thickness of the dielectric substrate will vary with the application, the dielectric substrate most typically is about 10 μm-100 μm thick. The flexible sheet 114 has conductive traces 120 thereon. In the particular embodiment illustrated in FIG. 1, the conductive traces are disposed on the bottom surface 118 of the flexible sheet 114. In other preferred embodiments, however, the conductive traces 120 may extend on the top surface 116 of the flexible sheet 114, on both the top and bottom faces or within the interior of the flexible substrate 114. Thus, as used in this disclosure, a statement that a first feature is disposed "on" a second feature should not be understood as requiring that the first feature lie on a surface of the second feature. Conductive traces 96 may be formed from any electrically conductive material, but most typically are formed from copper, copper alloys, gold or combinations of these materials. The thickness of the traces will also vary with the application, but typically is about 5 μm-25 μm. Traces 120 are arranged so that each trace has a support end 122 and a post end 124 remote from the support end.

Electrically conductive posts or pillars 126 project from the top surface 116 of flexible substrate 114. Each post 126 is connected to the post end 124 of one of the traces 120. In the particular embodiment of FIGS. 1 and 2, the posts 126 extend upwardly through the dielectric sheet 114, from the post ends of the traces. The dimensions of the posts can vary over a significant range, but most typically the height $h_p$ of each post above the top surface 116 of the flexible sheet is about 50-300 μm. Each post has a base 128 adjacent the flexible sheet 114 and a tip 130 remote from the flexible sheet. In the particular embodiment illustrated, the posts are generally frustoconical, so that the base 128 and tip 130 of each post are substantially circular. The bases of the posts typically are about 100-600 μm in diameter, whereas the tips typically are about 40-200 μm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric sheet 114, traces 120 and posts 126 can be fabricated by a process such as that disclosed in co-pending, commonly assigned U.S. Provisional Patent Application Ser. No. 60/508,970, the disclosure of which is incorporated by reference herein. As disclosed in greater detail in the '970 Application, a metallic plate is etched or otherwise treated to form numerous metallic posts projecting from the plate. A dielectric layer is applied to this plate so that the posts project through the dielectric layer. An inner or side of the dielectric layer faces toward the metallic plate, whereas the outer side of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

As best appreciated with reference to FIG. 2, the support ends 122 of the leads are disposed in a regular grid pattern corresponding to the grid pattern of the support elements, whereas the posts 126 are disposed in a similar grid pattern. However, the grid pattern of the posts is offset in the first and second horizontal directions x and y from the grid pattern of the support ends 122 and support elements 110, so that each post 126 is offset in the −y and +x directions from the support end 122 of the trace 120 connected to that post.

The support end 122 of each trace 120 overlies a support element 110 and is bonded to such support element, so that each post 126 is connected to one support element. In the embodiment illustrated, where the support elements are solder balls, the bonds can be made by providing the support elements on the contacts 106 of the chip and positioning the substrate or flexible sheet 114, with the posts and traces already formed thereon, over the support elements and reflowing the solder balls by heating the assembly. In a variant of this process, the solder balls can be provided on the support ends 122 of the traces. The process steps used to connect the support ends of the traces can be essentially the same used in flip-chip solder bonding of a chip to a circuit panel.

As mentioned above, the posts 126 are offset from the support elements 110 in the x and y horizontal directions. Unless otherwise specified herein, the offset distance $d_o$ (FIG. 2) between a post and a support element can be taken as the distance between the center of area of the base 128 (FIG. 1) of the post and the center of area of the upper end 132 (FIG. 1) of the support element 110. In the embodiment shown, where both the base of the post and the upper end of the support element have circular cross-sections, the centers of area lie at the geometric centers of these elements. Most preferably, the offset distance $d_o$ is large enough that there is a gap 134 (FIG. 2) between adjacent edges of the base of the post and the top end of the support element. Stated another way, there is a portion of the dielectric sheet 114 in gap 134, which is not in contact with either the top end 132 of the support element or the base 128 of the post.

Each post lies near the center of one zone 112 defined by four adjacent support elements 110, so that these support elements are disposed around the post. For example, support elements 110a-110d are disposed around post 126A. Each post is electrically connected by a trace and by one of these adjacent support elements to the microelectronic device 102. The offset distances from a particular post to all of the support elements adjacent to that post may be equal or unequal to one another.

In the completed unit, the upper surface 116 of the substrate or flexible sheet 114 forms an exposed surface of the package, whereas posts 126 project from this exposed surface and provide terminals for connection to external elements The conductive support elements 110 create electrically conductive paths between the microelectronic element 102 and the flexible substrate 114 and traces 120. The conductive support elements space the flexible substrate 114 from the contact bearing face 104 of microelectronic element 102. As further discussed below, this arrangement facilitates movement of the posts 126.

Figure 3:
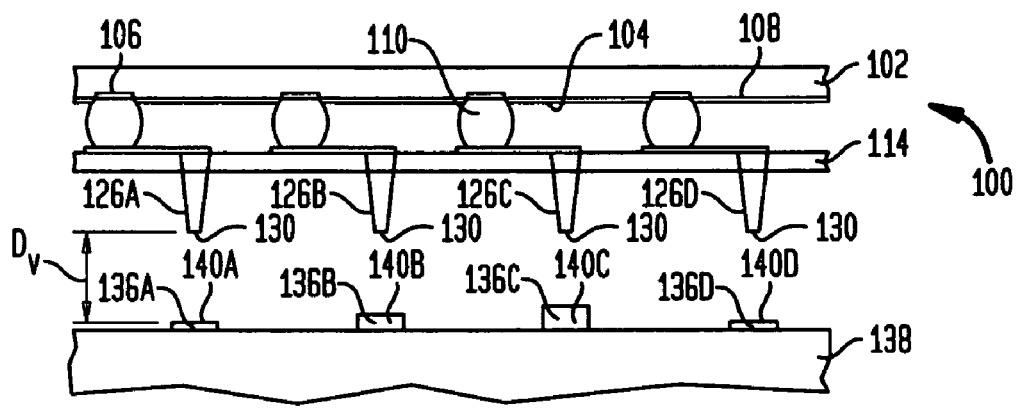
FIG. 3 is a diagrammatic elevational view depicting the package of FIGS. 1-2 in conjunction with a test circuit panel during one step of a method according to one embodiment of the invention.

Referring to FIG. 3, in a method of operation according to a further embodiment of the invention, a microelectronic package 100 such as the package discussed above with reference to FIGS. 1 and 2 is tested by juxtaposing the conductive posts 126 with contact pads 136 on a second microelectronic element 138 such as a circuitized test board. The conductive posts 126A-126D are placed in substantial alignment with top surfaces of the respective contact pads 136A-136D. As is evident in the drawing figure, the top surfaces 140A-140D of the respective contact pads 136A-136D are disposed at different heights and do not lie in the same plane. Such nonplanarity can arise from causes such as warpage of the circuit board 138 itself and unequal thicknesses of contact pads 136. Also, although not shown in FIG. 3, the tips 130 of the posts may not be precisely coplanar with one another, due to factors such as unequal heights of support elements 110; non-planarity of the front surface 104 of the microelectronic device; warpage of the dielectric substrate 114; and unequal heights of the posts themselves. Also, the package 100 may be tilted slightly with respect to the circuit board. For these and other reasons, the vertical distances Dv between the tips of the posts and the contact pads may be unequal.

Figure 4:
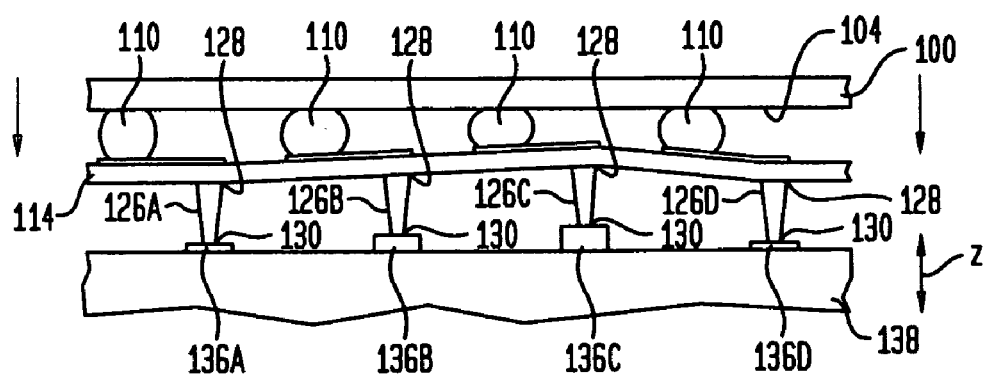
FIG. 4 is a view similar to FIG. 3 but depicting a later stage of the method.

Referring to FIG. 4, the microelectronic package 100 is moved toward the test board 138, by moving the test board, the package or both. The tips 130 of the conductive posts 126A-126D engage the contact pads 136 and make electrical contact with the contact pads. The tips of the posts are able to move so as to compensate for the initial differences in vertical spacing Dv (FIG. 3), so that all of the tips can be brought into contact with all of the contact pads simultaneously using only a moderate vertical force applied to urge the package and test board 138 together. In this process, at least some of the post tips are displaced in the vertical or z direction relative to other post tips.

A significant portion of this relative displacement arises from movement of the bases 128 of the posts relative to one another and relative to microelectronic element 100. Because the posts are attached to flexible substrate 114 and are offset from the support elements 110, and because the support elements space the flexible substrate 114 from the front surface 104 of the microelectronic element, the flexible substrate can deform. Further, different portions of the substrate associated with different posts can deform independently of one another.

Figure 5:
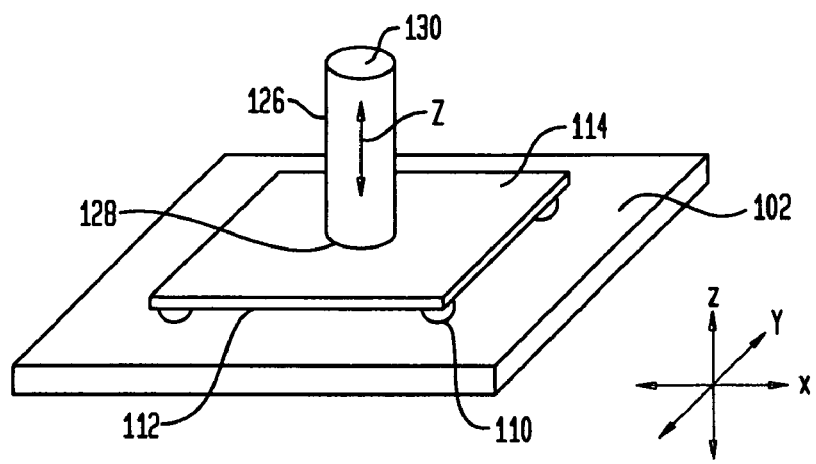
FIG. 5 is a diagrammatic, idealized perspective view depicting a portion of the package shown in FIGS. 1-4.

An idealized representation of the deformation of a single region 112 of substrate 114 is shown in FIG. 5. The support elements 110 disposed at the corners of the region allow the central part of the region to bend downwardly toward the microelectronic element 102, allowing the base 128 of post 126 to also move downward toward the microelectronic element. This deformation is idealized in FIG. 5 as a pure displacement of the post and the center of the region in the vertical or z direction. In practice, the deformation of the substrate may include bending and/or stretching of the substrate so that the motion of the base may include a tilting about an axis in the x-y or horizontal plane as well as some horizontal displacement of the base, and may also include other components of motion. For example, one portion of the region may be reinforced by a trace, and will tend to be stiffer than the other portions of the region. Also, a particular post may be positioned off-center in its region 112, so that the post lies closer to one support element, or to a pair of support elements, on one side of the post. For example, post 126a (FIG. 2) may be disposed closer to support elements 110a and 110b than to support elements 110c and 110d. The relatively small portion of the substrate between the post and support elements 110a and 110b will be stiffer in bending than the relatively large portion of the substrate between the posts and support elements 110c and 110d. Such non-uniformities tend to promote non-uniform bending and hence tilting motion of the posts. Tilting of the posts tends to move the tips 130 toward the microelectronic element. The support elements 110 at the corners of the individual regions substantially isolate the various regions from one another, so that the deformation of each region is substantially independent of the deformation of other regions of the substrate 114. Depending on the configuration of the posts, the posts 126 themselves may also flex or buckle to some degree, which provides additional movement of tips 76 in the vertical or z direction.

The independent displacement of the posts relative to one another allows all of the post tips 130 to contact all of the contact pads 136 on the test substrate. For example, the flexible substrate 114 in the vicinity of conductive post 126C flexes substantially more than the flexible substrate in the vicinity of conductive post 126B. In turn, the flexible substrate 114 in the vicinity of conductive post 126B flexes substantially more than the flexible substrate in the vicinity of conductive post 126A.

Because all of the post tips 130 can be engaged reliably with all of the contact pads 136, the package can be tested reliably by applying test signals, power and ground potentials through the test circuit board 138 and through the engaged posts and contact pads. Moreover, this reliable engagement is achieved with a simple test circuit board 138. For example, the contact pads 136 of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 μm of pin movement will suffice.

The internal features of package 100 are also compatible with high-frequency signals. The conductive support elements, traces and posts provide low-impedance signal paths between the tips of the posts and the contacts 106 of the microelectronic element. Because each post 126 is connected to an immediately adjacent conductive support element 110, traces 120 are quite short. The low-impedance signal paths are particularly useful in high-frequency operation, as, for example, where the microelectronic element must send or receive signals at a frequency of 300 MHz or more.

Figure 6:
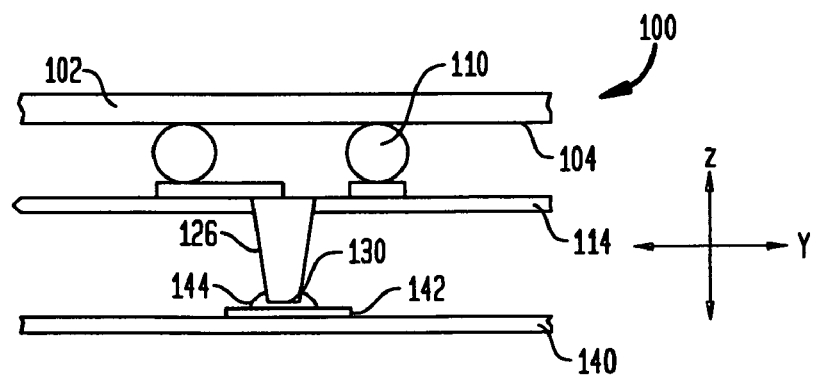
FIG. 6 is a fragmentary sectional view depicting a portion of an assembly including the package of FIGS. 1-5.

After testing the microelectronic package 100 may be removed from the test circuit board 138 and permanently interconnected with another substrate such as a circuit panel 140 (FIG. 6) having contact pads 142, as by bonding the tips 130 of posts 126 to the contact pads of the circuit panel using a conductive bonding material 144 such as a solder. The solder-bonding process may be performed using conventional equipment commonly used for surface-mounting microelectronic components. Thus, the solder masses may be provided on the posts 126 or on the contact pads 142, and may be reflowed after engaging the posts with the contact pads. During reflow, the surface tension of the solder tends to center the posts on the contact pads. Such self-centering action is particularly pronounced where the tips of the posts are smaller than the contact pads. Moreover, the solder 144 wets the sides of the posts to at least some extent, and thus forms a fillet encircling the tip of each post, as well as a strong bond between the confronting surfaces of the posts and pads.

Moreover, the tips 130 of the posts 126 can move relative to the microelectronic element 102 to at least some degree during service so as to relieve stresses arising from differential thermal expansion and contraction. As discussed above in connection with the testing step, the individual posts 126 can move relative to the microelectronic element and relative to the other posts by flexure or other deformation of substrate 114. Such movement can appreciably relieve stresses in the solder bonds between the posts and the contact pads, which would otherwise occur upon differential thermal expansion or contraction of the circuit board 140 and microelectronic element 102. Moreover, the conductive support elements or solder balls 110 can deform to further relieve stresses in solder masses 144. The assembly is highly resistant to thermal cycling stresses, and hence highly reliable in service.

An underfill material (not shown) such as an epoxy or other polymeric material may be provided around the tips of the posts and around the contact pads, so as to reinforce the solder bonds. Desirably, this underfill material only partially fills the gap between the package 100 and the circuit board 140. In this arrangement, the underfill does not bond the flexible substrate 114 or the microelectronic device to the circuit board. The underfill only reinforces the posts at their joints with the contact pads. However, no reinforcement is required at the bases of the posts, inasmuch as the joint between the base of each post and the associated trace is extraordinarily resistant to fatigue failure.

The assembly is also compact. Some or all of the posts 126 and contact pads 142 are disposed in the area occupied by the microelectronic element 102, so that the area of circuit board 140 occupied by the assembly may be equal to, or only slightly larger than, the area of the microelectronic element itself, i.e., the area of the front surface 104 of the microelectronic element 100.

The foregoing discussion has referred to an individual microelectronic element. However, the package may include more than one microelectronic element or more than one substrate. Moreover, the process steps used to assemble the flexible substrate, support elements and posts to the chips may be performed while the chips are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step. The ability of the packages to compensate for non-planarity in a test board or in the wafer itself greatly facilitates testing of a large unit.

The substrate and traces may deform locally in regions surrounding the posts. These regions tend to deform upwardly, leaving concavities in the bottom surface of the substrate. The posts may have heads, and these heads may be lodged partially or completely within the concavities. To control deformation of the substrate, the top surface of the substrate may be abutted against a die having holes aligned with locations where posts are forced through the substrate. Such a die can also help to prevent delamination of the substrate and traces. In variants of the process, the traces may be disposed on the top or bottom surface of a single-layer substrate. The resulting post-array substrate can be assembled with a microelectronic element to form a package as discussed above, or can be used in any other microelectronic assembly where a small post array is desirable. The assembly process allows selective placement of posts. It is not essential to provide the lands and holes in the traces. Thus, posts can be placed at any location along any trace. Moreover, the posts may be formed from essentially any conductive material. Different posts may be formed from different materials. For example, posts subject to severe mechanical loading can be formed entirely or partially from hard refractory metals such as tungsten, while other posts may be formed from softer metals such as copper. Also, some or all of the posts may be formed entirely or partially from corrosion-resistant metals such as nickel, gold or platinum.

The dielectric sheet, traces and posts may be fabricated by a process such as that disclosed in co-pending, commonly assigned U.S. Provisional Patent Application Ser. No. 60/508,970, the disclosure of which is hereby incorporated by reference herein. As disclosed in greater detail in the '970 Application, a metallic plate is etched or otherwise treated to form numerous metallic posts projecting from the plate. A dielectric layer is applied to this plate so that the posts project through the dielectric layer. An inner face of the dielectric layer faces toward the metallic plate, whereas the outer face of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

In the completed unit, the upper surface of the substrate or flexible sheet forms an exposed surface of the package, whereas posts project from this exposed surface and provide terminals for connection to external elements.

Figure 7A:
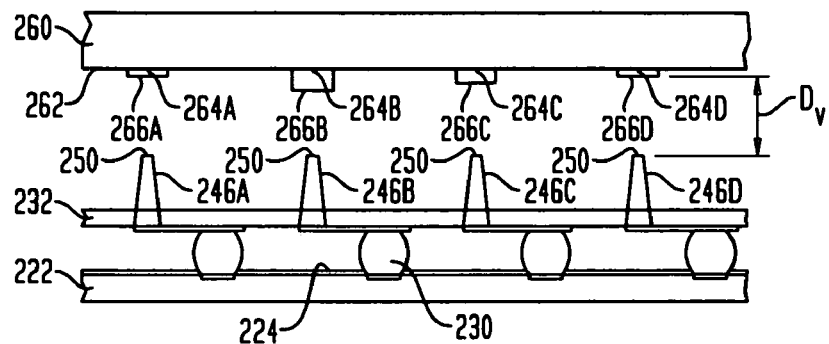
FIG. 7A shows a front elevational view of a testing assembly during a method of testing a microelectronic element, in accordance with one preferred embodiment of the present invention.
Figure 7B:
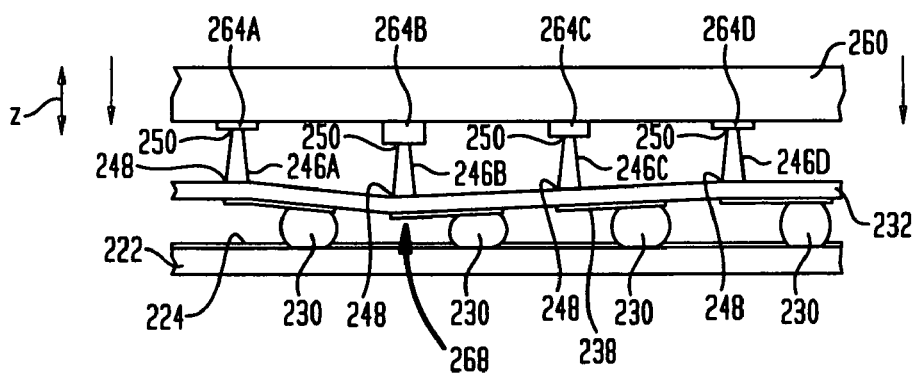
FIG. 7B shows the testing assembly of FIG. 7A during a later stage of testing the microelectronic element.

FIGS. 7A and 7B show a method of testing a microelectronic element 260 using a testing assembly 220. The microelectronic element 260, such as a semiconductor chip, has a front face 262 including contacts 264 accessible at the front face and a rear face 266 remote therefrom. In order to test the microelectronic element 260, the contacts 264 of the microelectronic element are juxtaposed with the conductive posts 246 of the test board 222. The contacts 264A-264D are placed in substantial alignment with top surfaces 250 of the respective conductive posts 246A-246D. As is evident in the drawing figure, the top surfaces 266A-266D of the respective contact pads 264A-264D are disposed at different heights and do not lie in the same plane. Such non-planarity can arise from causes such as warpage of the microelectronic element 260 itself and unequal thicknesses of contact pads 264. Also, although not shown in FIG. 7A, the tips 250 of the posts 246 may not be precisely coplanar with one another, due to factors such as unequal heights of support elements 230; non-planarity of the first surface 224 of the test board 222; warpage of the dielectric substrate 232; and unequal heights of the posts themselves. Also, the microelectronic element 260 may be tilted slightly with respect to the test board. For these and other reasons, the vertical distances Dv between the contacts 264 and the tips of the posts 246 may be unequal.

Referring to FIG. 7B, the microelectronic element 260 is moved toward the test board 222, by moving the test board, the microelectronic element or both toward one another. The contacts 264 engage the conductive posts 246A-246D for making electrical contact with the conductive posts. The tips 250 of the posts 246A-246D are able to move so as to compensate for the initial differences in vertical spacing Dv (FIG. 7A), so that all of the tips can be brought into contact with all of the contact pads simultaneously using with only a moderate vertical force applied to urge the microelectronic element 260 and the test board 222 together. In this process, at least some of the post tips 246A-246D are displaced in the vertical or z direction relative to others of the post tips.

A significant portion of this relative displacement arises from movement of the bases 248 of the posts relative to one another and relative to test board 220. Because the posts are attached to flexible substrate 232 and are offset from the support elements 230, and because the support elements space the flexible substrate 232 from the first surface 224 of the test board, the flexible substrate 232 can deform. Further, different portions of the substrate associated with different posts can deform independently of one another. As pressure is applied by contacts 264 onto the posts 246, the support elements 230 allow region 268 of flexible substrate 232 to bend downwardly toward the test board 222, allowing the base 248 of post 246B to also move downward toward the test board. This deformation is idealized in FIG. 7B as a pure displacement of the post and the center of the region in the vertical or z direction. In practice, the deformation of the substrate 232 may include bending and/or stretching of the substrate so that the motion of the base may include a tilting about an axis in the x-y or horizontal plane as well as some horizontal displacement of the base, and may also include other components of motion. For example, one portion of the region may be reinforced by a conductive trace (not shown), which will tend to be stiffer than the other portions of the region. Also, a particular post may be positioned off-center in its region 268, so that the post lies closer to one support element 230, or to a pair of support elements, on one side of the post. For example, post 246a may be disposed closer to support elements 230a and 230b than to support elements 230c and 230d. The relatively small portion of the substrate between the post and support elements 230a and 230b will be stiffer in bending than the relatively large portion of the substrate between the posts and support elements 230c and 230d. Such non-uniformities tend to promote non-uniform bending and hence tilting motion of the posts. Tilting of the posts tends to move the tips 250 toward the test board 222. The support elements 230 at the corners of the individual regions substantially isolate the various regions from one another, so that the deformation of each region is substantially independent of the deformation of other regions of the flexible, dielectric substrate 232. Depending on the configuration of the posts, the posts 246 themselves may also flex or buckle to some degree, which provides additional movement of tips 250 in the vertical or z direction.

Referring to FIG. 7B, the independent displacement of the posts 246 relative to one another allows all of the contacts 264 of the microelectronic element 260 to contact all of the post tips 250 on the test board 222. For example, the flexible substrate 232 in the vicinity of conductive post 246B flexes substantially more than the flexible substrate in the vicinity of conductive post 246C. In turn, the flexible substrate 232 in the vicinity of conductive post 246C flexes substantially more than the flexible substrate in the vicinity of conductive post 246D.

Because all of the contacts 264 can be engaged reliably with all of the post tips 250, the microelectronic element 260 can be tested reliably by applying test signals, power and ground potentials through the test board 222 and through the engaged contacts and posts.

The test circuit board can be made using the techniques commonly employed to form ordinary circuit boards. The test circuit board may incorporate electronic elements such as capacitors in close proximity to the contact pads as required for certain high-frequency signal processing circuits. The internal features of the microelectronic element 260 are also compatible with high-frequency signals. The conductive support elements 230, traces 238 and posts 246 provide low-impedance signal paths between the tips 250 of the posts and the contacts 264 of the microelectronic element 260. Because each post 246 is connected to an immediately adjacent conductive support element 230, traces 238 may be quite short. The low-impedance signal paths are particularly useful in high-frequency operation, as, for example, where the microelectronic element must send or receive signals at a frequency of 300 MHz or more.

After testing, the microelectronic element 260 may be removed from the testing assembly 220 and packaged using an interposer such as a circuitized, dielectric film. The microelectronic package, such as a ball grid array package, may be connected with contact pads on a circuit panel using a conductive bonding material such as solder. The solder-bonding process may be performed using conventional equipment commonly used for surface-mounting microelectronic components. Thus, the solder masses may be provided on the terminals of the microelectronic package, and may be reflowed after engaging the terminals with the conductive pads.

Figure 8:
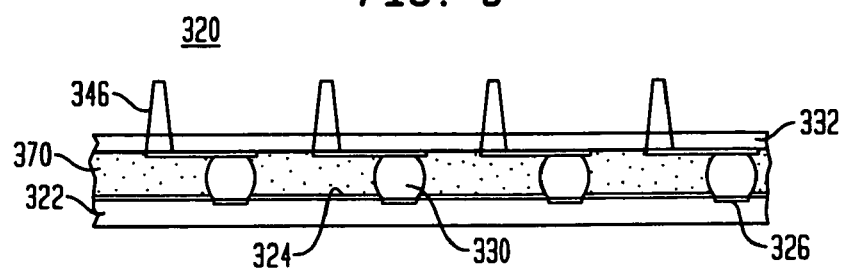
FIG. 8 shows a cross-sectional view of an assembly for testing microelectronic elements, in accordance with still further preferred embodiments of the present invention.

Referring to FIG. 8, in certain preferred embodiments of the present invention, a testing assembly 320 has a compliant material 370 positioned between a flexible substrate 332 and a test board 322. The compliant material layer 370 preferably does not substantially restrict movement of conductive posts 346. The compliant material desirably prevents contaminants from entering the testing assembly 320. Merely by way of example, the compliant material 370 may be a gel, foam or the like. Despite the presence of the compliant material, conductive elements 330 still support the flexible substrate 332 to a substantial degree.

As described above in earlier embodiments, the conductive posts are free to move independently of other conductive posts so as to ensure reliable contact between each conductive post and each conductive pad on a test board. The tips of the conductive posts are able to move so as to compensate for potential differences in vertical spacing so that all of the tips can be brought into contact with all of the conductive pads simultaneously using with only a moderate vertical force applied to urge a testable package and a test board together. In this process, at least some of the tips of the conductive posts are displaced in the vertical or z direction relative to others of the post tips. Further, different portions of the flexible substrate associated with different conductive posts can deform independently of one another. In practice, the deformation of the substrate may include bending and/or stretching of the substrate so that the motion of the base may include a tilting about an axis in the x-y or horizontal plane as well as some horizontal displacement of the base, and may also include other components of motion.

The dimensions of the conductive posts can vary over a significant range, but most typically the height of each post above the surface of the dielectric substrate is about 50-300 μm. Each post has a base adjacent the dielectric substrate and a tip remote from the dielectric substrate. In certain preferred embodiments, the posts are generally frustoconical, so that the base and tip of each post are substantially circular. The bases of the posts typically are about 100-600 μm in diameter, whereas the tips typically are about 40-200 μm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

In certain preferred embodiments, the conductive traces are disposed on a bottom surface of the dielectric layer. However, in other embodiments, the conductive traces may extend on the top surface of the dielectric layer; on both the top and bottom faces or within the interior of the dielectric layer. Thus, as used in this disclosure, a statement that a first feature is disposed "on" a second feature should not be understood as requiring that the first feature lie on a surface of the second feature. The conductive traces may be formed from any electrically conductive material, but most typically are formed from copper, copper alloys, gold or combinations of these materials. The thickness of the traces will also vary with the application, but typically is about 5 μm-25 μm.

The tips of the posts may not be precisely coplanar with one another, due to factors such as non-planarity of the front surface of the microelectronic device; warpage of the dielectric substrate; and unequal heights of the posts themselves. Also, the package may be tilted slightly with respect to the circuit board. For these and other reasons, the vertical distances between the tips of the posts and the contact pads may be unequal. The independent displacement of the posts relative to one another allows all of the post tips to contact all of the contact pads on the test substrate.

Because all of the post tips can be engaged reliably with all of the contact pads, the package can be tested reliably by applying test signals, power and ground potentials through the test circuit board and through the engaged posts and contact pads. Moreover, this reliable engagement is achieved with a simple test circuit board. For example, the contact pads of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 μm of pin movement will suffice.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable -electrical interconnections through penetration of oxide layers, in addition to traditional wiping action.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending commonly assigned application Ser. No. 10/985,126 filed Nov. 10, 2004, entitled "MICRO PIN GRID ARRAY WITH WIPING ACTION" [TESSERA 3.0-375], the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION" [TESSERA 3.0-376], the disclosure of which is also incorporated by reference herein, the flexible substrate may be provided with features to enhance the ability of the posts to move independently of one another and which enhance the tilting and wiping action.

Figure 9:
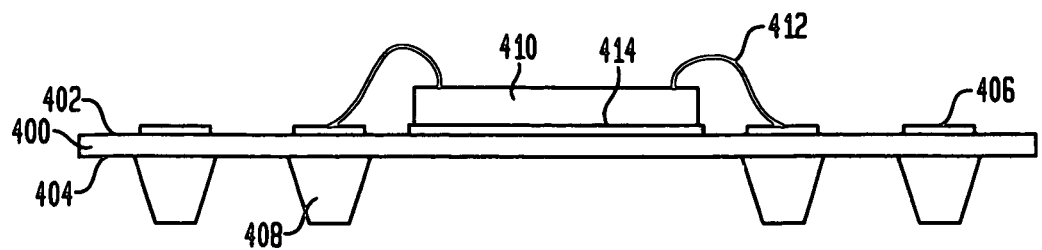
FIG. 9 shows a front elevational view of a microelectronic package, in accordance with another preferred embodiment of the present invention.

Referring to FIG. 9, in accordance with another preferred embodiment of the present invention, a microelectronic package includes a substrate 400 having a first or top surface 402 and a second or bottom surface 404. The substrate includes conductive pads 406 accessible at the top surface 402 and conductive posts 408 projecting from the second surface 404 of the substrate 400. The substrate 400 may be flexible and may be made of a dielectric material such as polyimide. The substrate may also have conductive traces (not shown) that extend over the top surface 402, the bottom surface 404 and/or between the top and bottom surfaces. A microelectronic element 410 such as a semiconductor chip is attached to the first surface 402 with a flexible substrate 400. The microelectronic element is electrically interconnected with one or more of the conductive pads 406 using conductive elements 412 such as wire bonds. An adhesive 414 is preferably used for attaching the microelectronic element 410 to the substrate 400.

Figure 10:
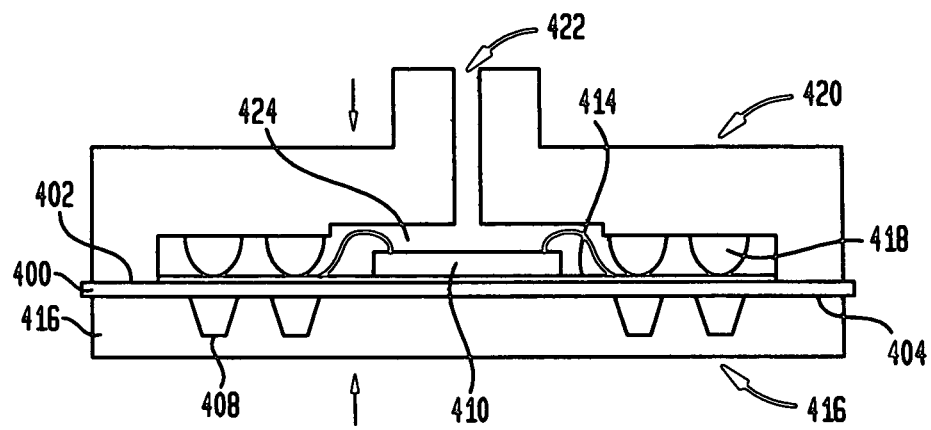
FIG. 10 shows the package of FIG. 9 after the package has been placed in a mold, in accordance with certain preferred embodiments of the present invention.

Referring to FIG. 10, the substrate 400 may be placed onto a bottom plate 416 of a mold. The bottom plate 416 preferably includes a top surface having recesses that are adapted to receive the conductive posts 408. The recesses may have a shape that generally mirrors the shape of the posts. After the flexible substrate 400 has been positioned atop the bottom plate 416 of the mold, conductive masses 418 such as elongated conductive elements or solder balls are provided atop the conductive pads 406 (FIG. 9) accessible at the first surface 402 of the flexible substrate 400. A top plate 420 of the mold is then positioned over the bottom plate 416 of the mold for capturing the flexible substrate 400 therebetween. Specifically, the top plate 420 of the mold is placed in contact with the first surface 402 of the flexible substrate and the bottom plate 416 of the mold is in contact with the second surface 404 of the flexible substrate 400. The mold top plate 420 includes an inlet 422 that enables a flowable material to be introduced into a cavity 424 defined by the mold bottom plate 416 and the mold top plate 420.

The bottom plate 416 and the top plate 420 of the mold are preferably pressed together to form an air-tight seal at the periphery thereof. As the plates are pressed together, the conductive masses 418 are planarized so that the top surfaces of the conductive masses lie in a common plane and are the same height above the top surface of the chip 410. In addition, the tips of the conductive posts 408 are also planarized so that the tips lie in a common plane and are all at the same vertical distance relative to the top surface of the chip 410. Although the present invention is not limited by any particular theory of operation, it is believed that the planarization of the conductive masses 418 and the conductive posts 408 will provide packages having uniform vertical heights across the horizontal width thereof. In addition, a plurality of packages may be produced, with each package having a substantially identical vertical height. As a result, microelectronic packages having the exact same vertical dimensions may be quickly and reliably produced.

After the conductive masses 418 and/or the conductive posts 408 have been compressed, a curable, flowable material such as a curable encapsulant is introduced into the cavity 424 of the mold through the inlet 422. The curable encapsulant may be clear, opaque or have optical properties anywhere along the scale between clear and opaque. For example, the encapsulant may be clear when the microelectronic element 410 is an LED or optically-sensitive chip. The curable material is preferably cured to form a cured encapsulant layer, which preferably provides stability to the package and protects the microelectronic element 410, the conductive wires 414 and the conductive masses 418.

Figure 11:
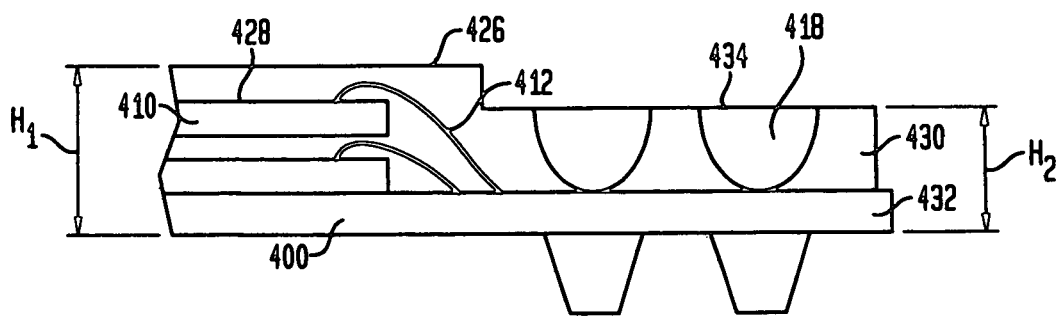
FIG. 11 shows the package of FIGS. 9 and 10 after an overmold has been formed on the package, in accordance with certain preferred embodiments of the present invention.

Referring to FIG. 11, the cured encapsulant 426 includes a central section 428 having a height $H_1$ that is sufficient to cover the semiconductor chip 410 and the wire bonds 412. The encapsulant 426 also includes a peripheral region 430 that extends to a peripheral edge 432 of the flexible substrate 400. The encapsulant in the peripheral region has a height $H_2$ that is less than $H_1$. The solder masses 418 include top surfaces 434 that are exposed at a top surface of the peripheral portion 430 of the encapsulant 426. In certain preferred embodiments, the accessibility of the solder masses 418 is provided by the top mold plate 420. As shown in FIG. 10, the height of the cavity 424 in the area of the solder masses 418 is less than the height of the cavity overlying the chip 410 and the wire bonds 414. As a result, the encapsulant 426 does not cover the top surfaces of the solder masses 418 so that the solder masses are accessible at a top surface of the cured encapsulant layer 426.

Figure 12:
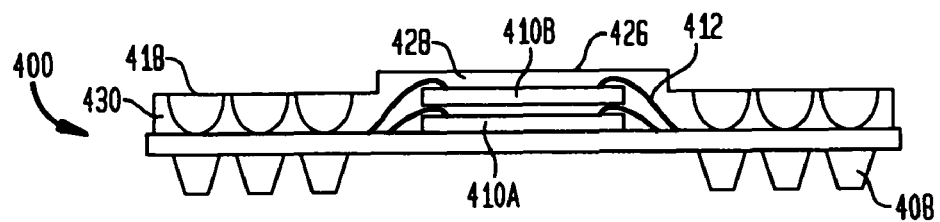
FIG. 12 shows another view of the package shown in FIG. 11.

FIG. 12 shows the microelectronic package shown in FIG. 11. The package includes the flexible substrate 400 having a first microelectronic element 410A that is electrically interconnected with one or more of the conductive posts 408 and/or one or more of the conductive masses 418 accessible at a peripheral region of the encapsulant 426. The microelectronic package also preferably includes a second microelectronic element 410B that is positioned over the first microelectronic element 410A. The second microelectronic element 401B is also electrically interconnected with one or more of the conductive posts 408 and/or one or more of the conductive masses 418. As noted above, a central region 428 of the encapsulant 426 has a height sufficient to cover the microelectronic elements 410A, 410B and the conductive wires 412 used for electrically interconnecting the microelectronic elements with the substrate 400. The peripheral region 430 of the encapsulant has a lower height so that the tops of the conductive masses 418 are accessible and exposed at an exposed surface of the peripheral region 430 and hence, at an exposed surface of the package. The structure shown in FIG. 12 provides a microelectronic package that may be stacked either on top of or below another microelectronic package.

Figure 13:
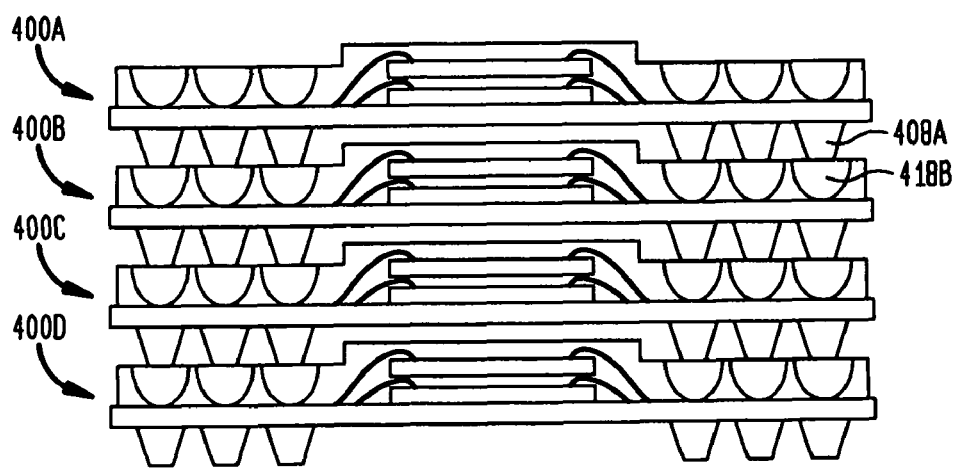
FIG. 13 shows a stack of microelectronic packages, in accordance with certain preferred embodiments of the present invention.

FIG. 13 shows the microelectronic package of FIG. 12 stacked on top of another microelectronic packages. Specifically, a first microelectronic package 400A is stacked atop a second microelectronic package 400B, which is stacked atop a third microelectronic package 400C, which is stacked atop a fourth microelectronic package 400D. The four microelectronic packages are preferably electrically interconnected with one another. The conductive posts 408A-of the first microelectronic package 400A are in contact with the conductive masses 418B of the second microelectronic package 400B. During assembly, the conductive masses 418B are preferably elevated in temperature so as to at least partially transform into a molten state so that the conductive posts 408A can be at least partially inserted therein. After the connections between the conductive masses and the posts have been formed, the temperature of the conductive masses 418B may be lowered so that the conductive masses re-solidify for permanently connecting the conductive posts 408A and the conductive masses 418B. The electrical connections between the second microelectronic package 400B and the third microelectronic package 400C are made in a similar fashion, as are the electrical interconnections between the third microelectronic package 400C and the fourth microelectronic package 400D. Although FIG. 13 shows an assembly including four microelectronic packages stacked one atop the other, the present invention contemplates that any size package of two or more microelectronic packages may be manufactured. For example, in one embodiment, a stack of five or more microelectronic packages may be possible. The uppermost or lowermost package in the stack may be connected to an external element such as a circuit board or a test board. Before the individual microelectronic packages are assembled together in a stack, each individual package is preferably tested.

Figure 14:
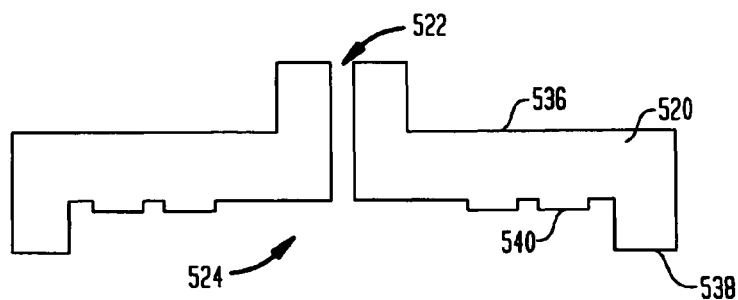
FIG. 14 shows a top plate of a mold for making a microelectronic package, in accordance with certain preferred embodiments of the present invention.

Referring to FIG. 14, in another preferred embodiment of the present invention, a top plate 520 of a mold includes a top surface 536 and a bottom surface 538. The mold top plate 520 includes an inlet 522 that extends into a cavity 524. The mold top plate 520 also includes one or more projections 540 that extend into the cavity 524.

Figure 15:
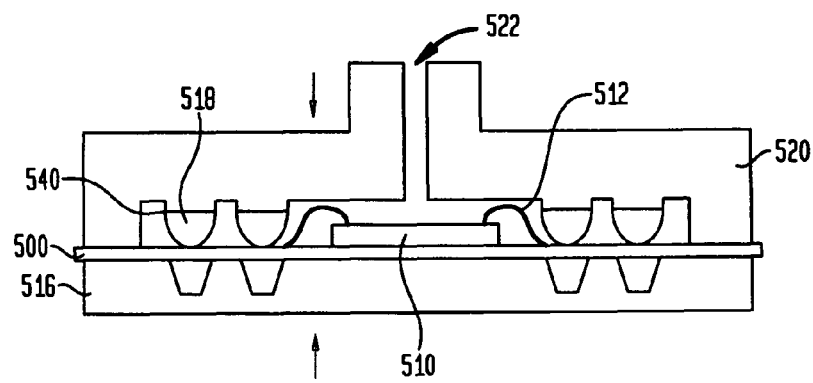
FIG. 15 shows a microelectronic package and a mold for forming an overmold on the package, in accordance with certain preferred embodiments of the present invention.

Referring to FIG. 15, after the substrate 500 has been positioned atop the mold bottom plate 516, the mold top plate 520 is secured over the substrate 500. The projections 540 of the mold top plate 520 preferably compress the conductive masses 518 that are positioned atop the first surface of the substrate 500. The conductive posts may also be compressed. As described above, the compression of the conductive masses and/or the conductive posts serves to planarize the conductive elements so that the vertical height of the package is uniform across the package. After compression, a curable encapsulant material is introduced through inlet 522. The curable encapsulant covers the microelectronic element 510, the conductive wires 512 and the conductive masses 518.

Figure 16:
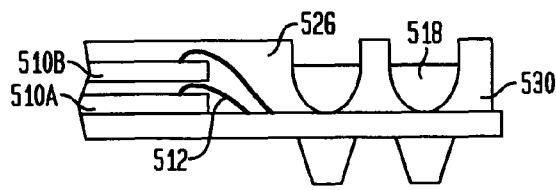
FIG. 16 shows a partial front elevational view of a microelectronic package having an overmold, in accordance with certain preferred embodiments of the present invention.

Referring to FIG. 16, after the encapsulant material is cured, the package 500 may be removed from the mold. As shown in FIG. 16, the encapsulant 526 covers microelectronic elements 510A, 510B and conductive wires 512. The peripheral portion 530 of the encapsulant 526 has a height that is greater than the height of the conductive masses 518. As a result, although the conductive masses 518 are recessed within the openings, the conductive masses have surfaces which are exposed and accessible at the top of the encapsulant layer 526.

Figure 17:
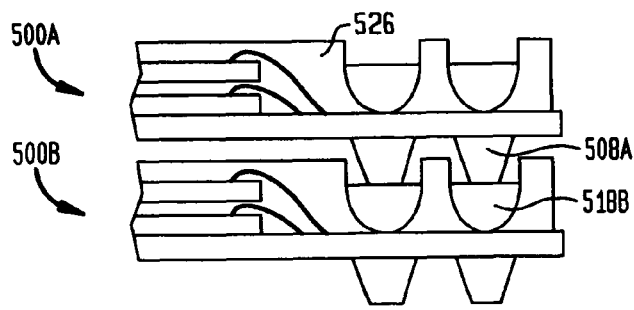
FIG. 17 shows the package of FIG. 16 in a stacked assembly.

Referring to FIG. 17, microelectronic packages similar to the one shown in FIG. 16 may be stacked atop one another to form a microelectronic stack. As shown in FIG. 17, a first microelectronic package 500A is stacked atop a second microelectronic package 500B. The conductive posts 508A of the first microelectronic package 500A are in electrical contact with the conductive masses 518B of the second microelectronic package 500B. The stacked package has a lower overall silhouette due to the recess of the conductive masses 518 in the encapsulant layer 526.

Figure 18:
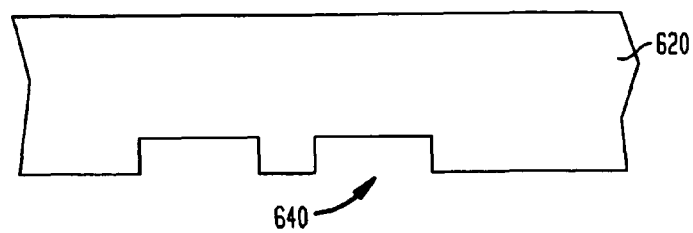
FIGS. 18 and 19 show a mold for compressing conductive elements on a microelectronic package, in accordance with certain preferred embodiments of the present invention.
Figure 19:
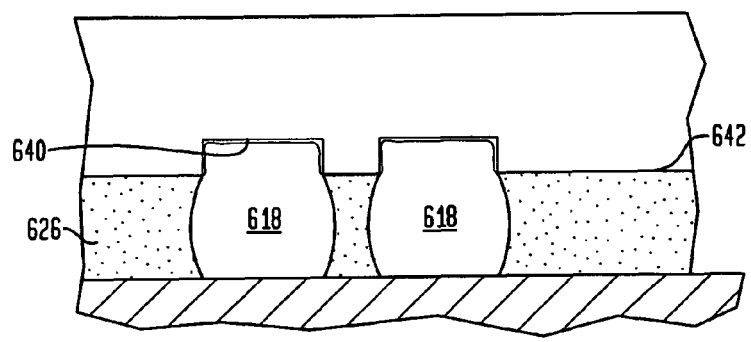

FIG. 18 shows a top plate 620 of a mold, in accordance with another preferred embodiment of the present invention. The top plate 620 includes a cavity having depressions 640 formed therein that are preferably provided in the same locations as the projections 540 shown in the FIG. 14 embodiment. Referring to FIG. 19, as the conductive masses are compresssed by the mold, the conductive masses 618 extend into the recesses 640. As a result, when the encapsulant 626 is introduced into the mold, the upper ends of the conductive masses project above the top surface 642 of the encapsulant 626.

Figure 20:
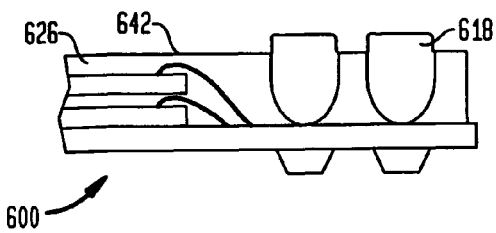
FIG. 20 shows a partial view of a microelectronic package, in accordance with certain preferred embodiments of the present invention.

Referring to FIG. 20, the encapsulant 626 may be cured and the package 600 removed from the mold. Due to the recesses 640 in the top plate 620 of the mold (FIG. 18), the upper ends of the conductive masses 618 project above the top surface 642 of the encapsulant 626.

Figure 21:
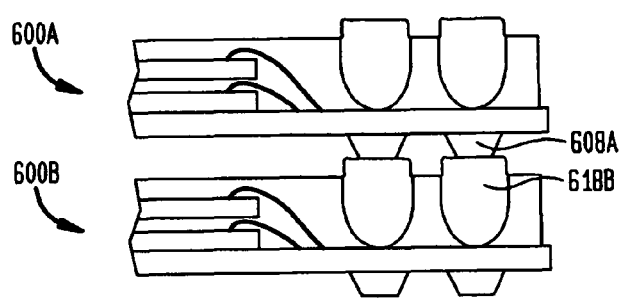
FIG. 21 shows the package of FIG. 20 in a stacked assembly.

Referring to FIG. 21, two or more of the microelectronic packages 600A, 600B shown in FIG. 20 may be stacked atop one another to form a microelectronic stack. As shown in FIG. 21, the conductive posts 608A of the first microelectronic package 600A are in contact with the conductive masses 618B of the second microelectronic package 600B for forming the electrical interconnection. When assembling the stack, the conductive masses 618 are preferably transformed into an at least partially molten state so that the conductive post 608 may be inserted therein. After the temporary connection has been made, the conductive masses may be transformed back into a solid state for forming a permanent connection between the conductive posts and the conductive masses. Although only two microelectronic packages are shown in FIG. 21, it is contemplated that the present invention will enable three, four or more microelectronic packages to be stacked atop one another.

Figure 22:
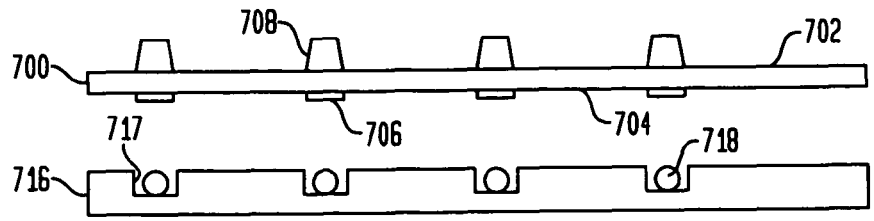
FIGS. 22-24 show a method of making a microelectronic package, in accordance with another preferred embodiment of the present invention.

Referring to FIG. 22, in accordance with another preferred embodiment of the present invention, a microelectronic package includes a substrate 700, such as a flexible substrate made of a dielectric material, having a first surface 702 and a second surface 704. The package includes conductive posts 708 projecting from the first surface 702 and conductive pads 706 accessible at the second surface 704. The flexible substrate is juxtaposed with a bottom plate 716 of a mold having recesses 717 formed therein. A conductive mass 718, such as a solder ball, is placed in each of the recesses 717 of the bottom plate 716. The substrate 700 is preferably placed in contact with the bottom plate 716 so that each of the conductive pads 706 is in contact with one of the conductive masses 718.

Figure 23:
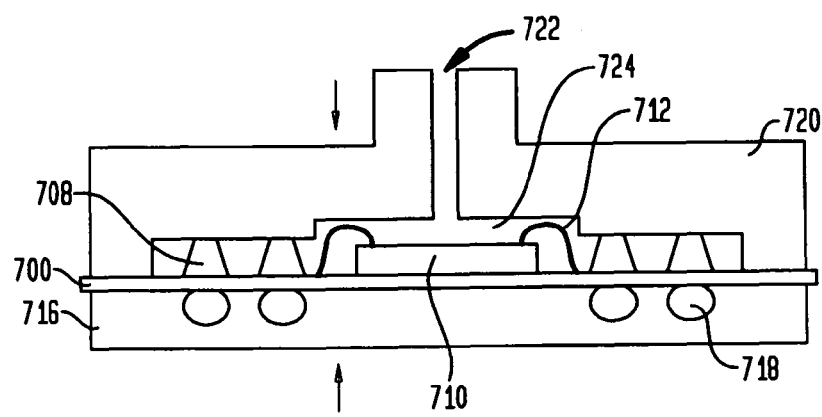

Referring to FIG. 23, a top plate 720 of a mold is preferably placed over the microelectronic package and the bottom plate 716 of the mold. The substrate 700 of the microelectronic package is preferably sandwiched between the mold bottom plate 716 and the mold top plate 720. The mold is compressed for planarizing the tips of the conductive posts 708 and the bottoms of the conductive masses 718. The mold may be heated for transforming the conductive masses 718 to an at least partially molten state for wetting the conductive masses to the conductive pads 706. A curable encapsulant material may be introduced through an inlet 722 of the top plate 720. The curable encapsulant material preferably enters the cavity 724 and covers the microelectronic element 710, the conductive wire 712 and surrounds the conductive posts 708, with the tips of the posts being accessible and exposed at an upper surface of the encapsulant layer. The curable liquid encapsulant is preferably cured to provide the microelectronic package shown in FIG. 24. The encapsulant layer may be rigid, at least partially rigid or compliant. The encapsulant 726 preferably has a central region 728 that covers the microelectronic elements 710A, 710B and the conductive wires 712. The tips of the conductive posts 708 are preferably accessible through the encapsulant at a peripheral region 730 of the encapsulant 726. The conductive masses 718 are accessible at a bottom of the microelectronic package.

Figure 24:
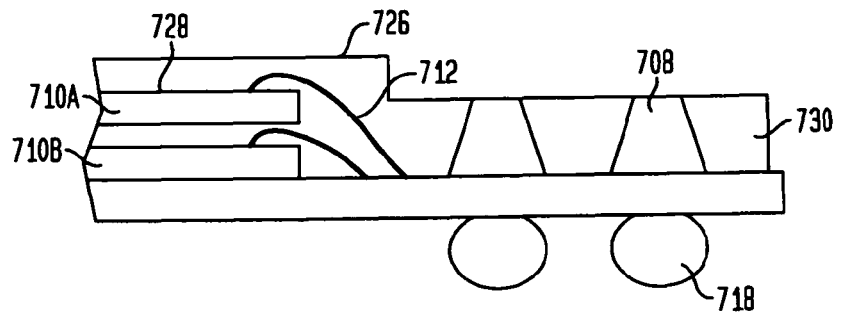
Figure 25:
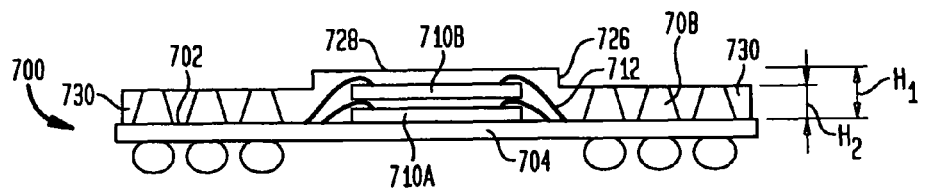
FIG. 25 shows a microelectronic package, in accordance with another preferred embodiment of the present invention.

FIG. 25 shows another view of the microelectronic package shown in FIG. 24. The microelectronic package includes substrate 700 having a first surface 702 and a second surface 704 remote therefrom. The package includes a first microelectronic element 710A overlying a second microelectronic element 710B. The microelectronic elements are electrically interconnected with the substrate using conductive wires 712. The package includes encapsulant layer 726 having a central region 728 having a height $H_1$ and a peripheral region 730 having a lower height $H_2$. The height $H_1$ of the central region 728 is sufficient to cover the microelectronic elements 710A, 710B and the wire bond 712. The lower height $H_2$ of the peripheral region 730 enables the tips of the conductive posts 708 to be accessible therethrough and have portions which are exposed at an exposed surface of the peripheral region 730 of the encapsulant layer, and hence, at an exposed surface of the package. Thus, the structure shown in FIG. 25 provides a microelectronic package having conductive elements, such as conductive posts, accessible and having portions exposed at a top surface thereof and second conductive elements, such as solder balls, accessible at a bottom surface thereof. As a result, the microelectronic package may be stacked with one or more other microelectronic packages. In other preferred embodiments, the package may have first conductive posts accessible at a top of the package and second conductive posts accessible at a bottom of the package for stacking.

Figure 26:
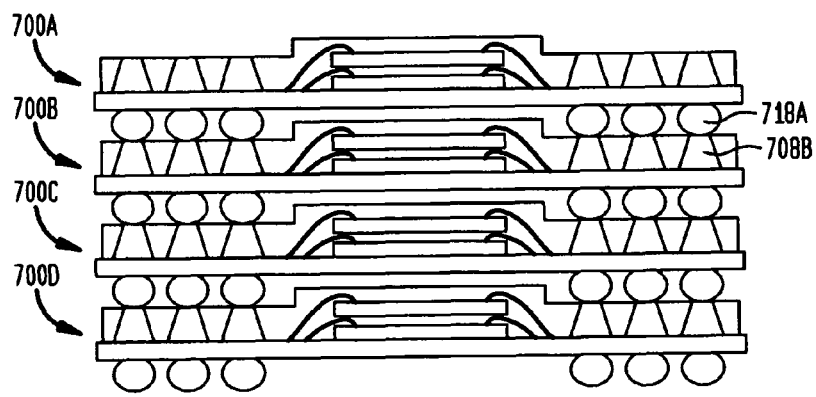
FIG. 26 shows the package of FIG. 25 in a stacked assembly.

FIG. 26 shows the microelectronic package of FIG. 25 being stacked atop similarly designed microelectronic packages. As shown in FIG. 26, a first microelectronic package 700A is stacked atop a second microelectronic package 700B, which is stacked atop a third microelectronic package 700C, which is stacked atop a fourth microelectronic package 700D. The electrical interconnections are formed between the first and second packages by the conductive masses 718A being in contact with the tips of the conductive posts 708B of the second microelectronic package 700B. The embodiment shown in FIG. 26 shows four microelectronic packages being stacked one atop the other, but it is contemplated that other embodiments may include two, three, four or more microelectronic packages stacked one atop another.

Figure 27:
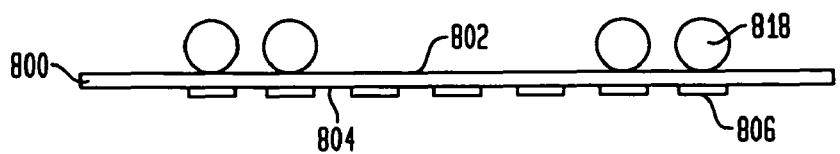
FIGS. 27-32 show a method of making a microelectronic package, in accordance with certain preferred embodiments of the present invention.

Referring to FIG. 27, in certain preferred embodiments of the present invention, a microelectronic package includes a substrate 800, such as a flexible, circuitized substrate, having a first surface 802 and a second surface 804. Conductive masses 818, such as solder, are placed atop the first surface 802 and conductive pads 806 are accessible at the second surface 804. At least some of the conductive masses 818 are preferably in electrical connection with at least some of the conductive pads 806.

Figure 28:
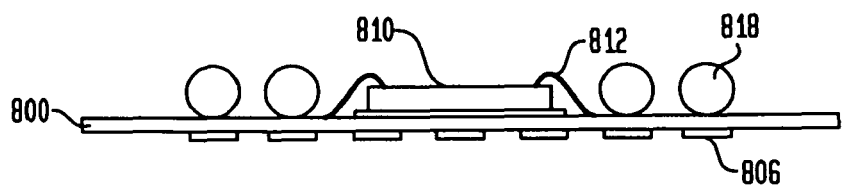

Referring to FIG. 28, a microelectronic element 810 such as a semiconductor chip is attached to the first surface 802 of the substrate 800. The microelectronic element 810 is electrically interconnected with one or more of the conductive masses 818 and one or more of the conductive pads 806 via wire bonds 812.

Figure 29:
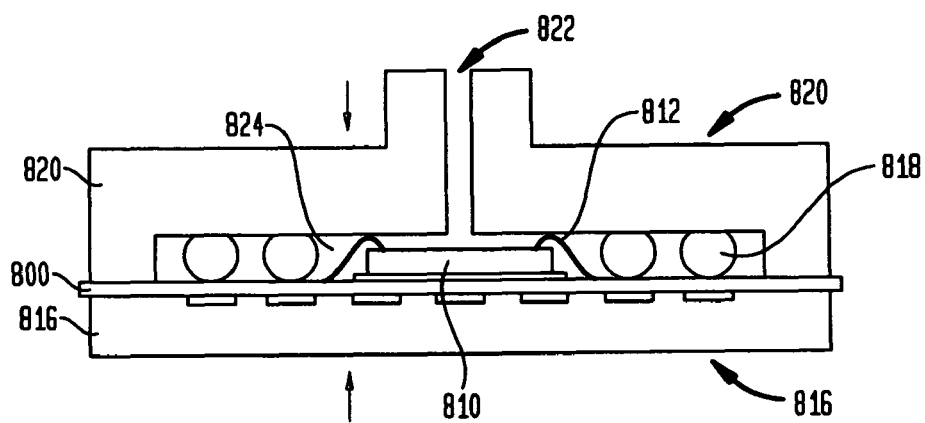

Referring to FIG. 29, the microelectronic package is placed in a mold including a bottom plate 816 and a top plate 820 having an inlet 822. The flexible substrate 800 is preferably sandwiched between the bottom plate 816 and the top plate 820. The mold includes a cavity 824 extending between the top plate 820 and the bottom plate 816. When the mold is closed, an underside of the top plate 820 at least partially compresses or collapses the conductive masses 818. As a result, top surfaces of the compressed conductive masses are preferably planarized so that they lie in a common plane. A curable encapsulant is preferably introduced into the cavity 824 through an inlet 822. The curable encapsulant preferably covers the microelectronic element 810, the conductive wires 812, and surrounds the conductive masses 818.

Figure 30:
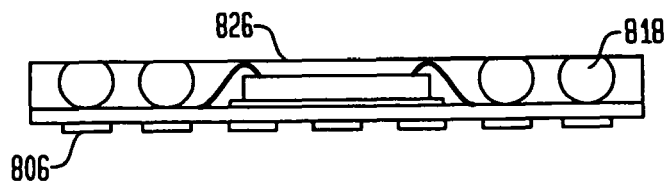

Referring to FIG. 30, the encapsulant 826 is cured to provide an overmold, whereby the compressed conductive masses 818 have top surfaces that lie in a common plane and are exposed and accessible at a top surface of the encapsulant 826. The conductive pads 806 remain accessible at a bottom of the microelectronic package.

Figure 31:
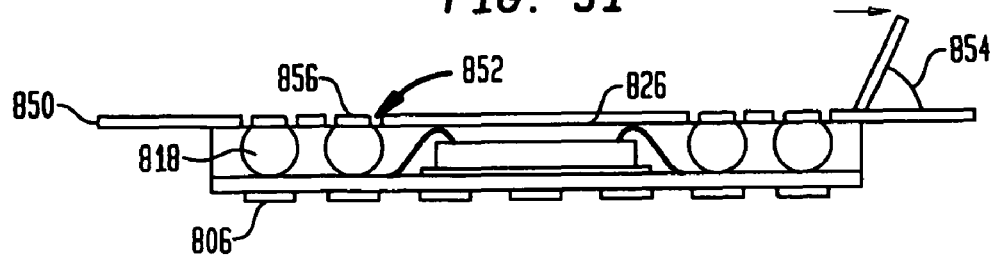

Referring to FIG. 31, a stencil 850 having opening 852 is preferably positioned atop the encapsulant layer 826 of the microelectronic package. The stencil openings 852 are preferably placed in substantial alignment with the conductive masses 818 exposed and accessible at the top surface of the encapsulant 826. A solder paste 854 may be swept over the stencil 850 so that a mass of solder paste 856 is deposited atop each conductive mass 818. In other preferred embodiments, the solder paste 856 may be deposited atop the conductive masses without using a stencil.

Figure 32:
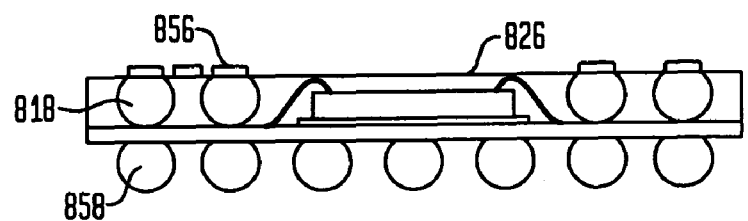

Referring to FIG. 32, the conductive masses 818 and the solder paste 856 deposited thereon are desirably reflowed to form an elongated conductive element that projects above a top surface of the encapsulant layer 826. As shown in FIG. 32, a portion of the conductive element is exposed. Conductive elements 858 such as solder balls are attached to the conductive pads 806 at the bottom of the package.

Figure 33:
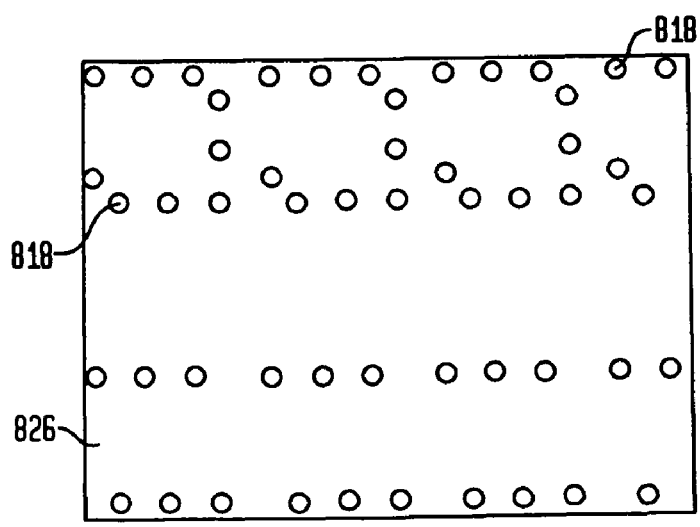
FIG. 33 shows a top plan view of the microelectronic package shown in FIG. 30.
Figure 34:
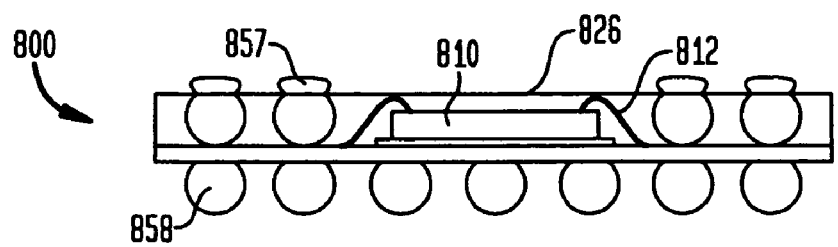
FIG. 34 shows another view of the package shown in FIG. 32.

FIG. 33 shows the compressed or collapsed solder balls 818, which are accessible at a top surface of the encapsulant layer 826. FIG. 34 shows another view of the package of FIG. 32 including substrate 800, microelectronic element 810 secured atop substrate 800 and conductive wires 812 for electrically interconnecting the microelectronic element 810 and the substrate 800. The package includes encapsulant layer 826 and elongated conductive elements projecting above a top surface of the encapsulant layer. The elongated conductive -elements comprise the reflowed solder balls and solder paste.

Figure 35:
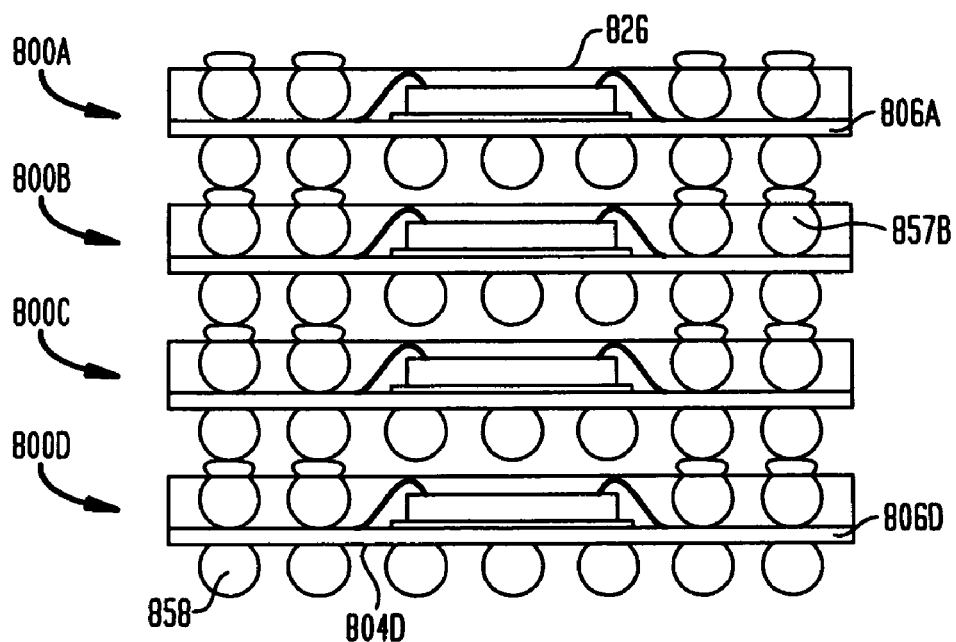
FIG. 35 shows the package of FIG. 34 in a stacked assembly.

FIG. 35 shows the microelectronic package of FIG. 34, after the package has been assembled into a microelectronic stack. The stack desirably includes first microelectronic package 800A stacked atop second microelectronic package 800B, which is stacked atop third microelectronic package 800C, which is stacked atop fourth microelectronic package 800D. The conductive pads 806A of the first microelectronic package 800A are in contact with the elongated conductive elements 857B of the second microelectronic package 800B. Specifically, the conductive pad 806A is in contact with the portion of the elongated conductive element 857B that projects above the top surface of the encapsulant layer 826. As a result, a stackable assembly may be formed. As shown in FIG. 35, only the bottom microelectronic package 800D has solder balls 858 attached to the conductive pads 806D accessible at the second surface 804D of the fourth package 800D.

Figure 36:
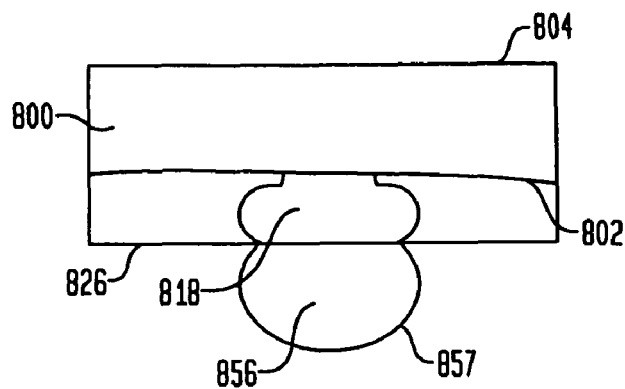
FIG. 36 shows an X-ray image of a section of the package shown in FIG. 34.
Figure 37A:
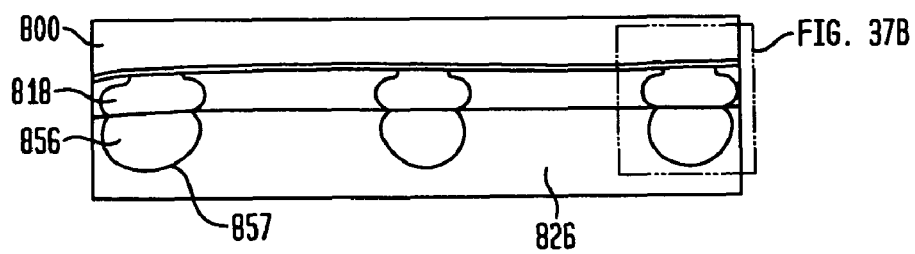
FIGS. 37A shows a cross-sectional view of a section of the package shown in FIG. 34.
Figure 37B:
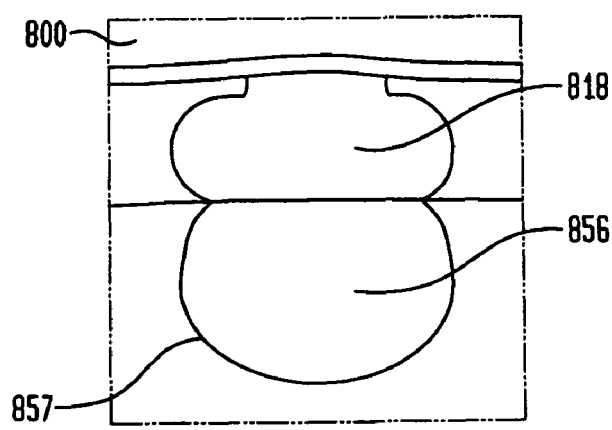
FIG. 37B shows a magnified view of a section of the package shown in FIG. 34.

FIG. 36 shows an X-ray image after the elongated conductive elements 857 have been formed. As shown in FIG. 36, flexible substrate 800 includes first surface 802 and second surface 804. Initially, solder balls 818 are provided over the first surface 802 and flexible substrate 800. The solder balls are compressed by the mold for planarization and the encapsulant layer 826 is introduced into the cavity of the mold for surrounding the compressed solder balls 818. A solder paste 856 is preferably deposited atop each of the compressed solder balls 818 using the stencil shown and described above in FIG. 31. The compressed solder balls 818 and the solder paste 856 is reflowed for forming the elongated conductive element 857. FIG. 37A shows a cross-sectional view of the assembly shown in FIG. 36. The microelectronic package includes substrate 800 with compressed solder balls 818 formed thereon and solder paste 856 deposited atop each of the compressed solder balls 818. The solder balls 818 and the solder paste 856 are reflowed to form the elongated conductive elements 857. The top of the elongated conductive element 857 extends above the top surface of the encapsulant layer 826. FIG. 37B shows a magnified view of one of the elongated conductive elements 857 shown in FIG. 37A.

Figure 38:
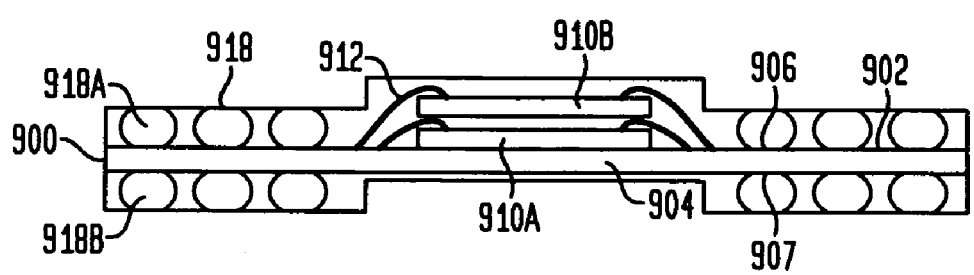
FIG. 38 shows a microelectronic package, in accordance with another preferred embodiment of the present invention.

FIG. 38 shows a microelectronic package in accordance with another preferred embodiment of the present invention. The package includes a substrate 900 having a top surface 902 and a bottom surface 904 remote therefrom. A first microelectronic element 910A is attached to the first surface 902 of the substrate 900 and a second microelectronic element 910B is provided over the first microelectronic element 910A. In other preferred embodiments, three or more microelectronic elements may be stacked atop the substrate 900 in a manner similar to the manner shown in FIG. 38. The microelectronic elements are electrically interconnected with the substrate using conductive wires 912. The substrate 900 includes first conductive pads 906 accessible at the top surface 902 of the substrate and second conductive pads 907 accessible at the second surface 904 of the substrate. Conductive masses 918A, 918B, such as solder balls, are provided over the respective conductive pads 906, 907. As shown in FIG. 38, first solder balls 918A are provided over the conductive pads 906 accessible at the first surface 902 of the substrate and second solder balls 918B are provided over the conductive pads 907 accessible at the second surface 904 of the substrate 900. The package is desirably placed in a mold similar to one of the molds shown and described above for at least partially compressing/collapsing both the first solder balls 918A and the second solder balls 918B. The mold may be heated for transforming the solder balls into an at least partially molten state. The mold preferably planarizes the solder balls so that the top surfaces of the first conductive masses 918A lie in a first common plane and the bottom surfaces of the second conductive masses 918B lie in a second common plane. Although the present invention is not limited by any particular theory of operation, it is believed that the planarization of the conductive masses will enable the mass production on a plurality of microelectronic packages, each package having a standard height. A curable encapsulant may be injected into the mold for covering the microelectronic chips 910A, 910B, the conductive wires 912 and surrounding the compressed or collapsed conductive masses 918A, 918B. The mold is preferably designed so that the top surfaces of the first set of collapsed solder balls 918A are accessible and exposed at the top surface of the encapsulant and the bottom surfaces of the second set of solder balls 918B are accessible and exposed at the bottom surface of the encapsulant. The structure shown in FIG. 38 may be stacked atop other microelectronic packages to form a stacked assembly, similar to the stacked assembly shown in FIG. 35. In certain preferred embodiments, one or more of the conductive masses 918A, 918B may be replaced by a conductive post, such as the posts shown in FIG. 25 of the present application.

In certain preferred embodiments of the present invention, a microelectronic package, assembly or stack may include one or more features of one or more of the embodiments disclosed in U.S. application Ser. No. 10/959,465, filed Oct. 6, 2004, entitled "Formation of Circuitry With Modification of Feature Height" [TESSERA 3.0-358]; U.S. application Ser. No. 11/166,861, filed Jun. 24, 2005, entitled "Structure With Spherical Contact Pins" [TESSERA 3.0-416]; U.S. application Ser. No. 11/014,439, filed Dec. 16, 2004 [TESSERA 3.0-374], claiming priority of U.S. Provisional Application Ser. No. 60/533,210, filed Dec. 30, 2003; U.S. application Ser. No. 10/985,126, filed Nov. 10, 2004 [TESSERA 3.0-375], claiming priority of U.S. Provisional Application Ser. No. 60/533,393, filed Dec. 30, 2003; U.S. application Ser. No. 10/985,119, filed Nov. 10, 2004 [TESSERA 3.0-376], claiming priority of U.S. Provisional Application Ser. No. 60/533,437, filed Dec. 30, 2003; U.S. patent application Ser. No. 11/140,312, filed May 27, 2005 [TESSERA 3.0-415], claiming priority of U.S. Provisional Application Ser. No. 60/583,066, filed Jun. 25, 2004 and U.S. Provisional Application Ser. No. 60/621,865, filed Oct. 25, 2004; U.S. Provisional Application Ser. No. 60/662,199, filed Mar. 16, 2005 [TESSERA 3.8-429]; U.S. Patent Application Publication No. 2005/0035440 [TESSERA 3.0-307]; and U.S. Provisional Application Ser. No. 60/753,605, filed on even date herewith, entitled "MICROELECTRONIC PACKAGES AND METHODS THEREFOR" and assigned attorney docket number TESSERA 1.0-482, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making a microelectronic assembly comprising:
   providing a microelectronic package including a substrate, a microelectronic element overlying said substrate and at least two conductive elements projecting from a surface of said substrate, first and second conductive elements of said at least two conductive elements having surfaces remote from said surface of said substrate and being electrically connected through said substrate to said microelectronic element for carrying a first signal electric potential on said first conductive element and for simultaneously carrying a second electric potential on said second conductive element, said second electric potential being different from said first signal electric potential;
   molding a dielectric material around said at least two conductive elements for supporting said microelectronic package and so that said remote surfaces of said at least two conductive elements are deformed during said molding to present at least substantially planar surfaces, wherein said remote surfaces remain accessible and exposed at an exterior surface of said molded dielectric material.

2. The method as claimed in claim 1, wherein said at least two conductive elements project from a first surface of said substrate and said substrate further comprises a second surface remote from said first surface and at least a third conductive element and a fourth conductive element projecting from said second surface of said substrate, said at least third and fourth conductive elements having surfaces remote from said second surface of said substrate and being electrically connected through said substrate to said microelectronic element for carrying a third signal electric potential on said third conductive element and for simultaneously carrying a fourth electric potential on said fourth conductive element, said fourth electric potential being different from said third signal electric potential.

3. The method as claimed in claim 2, further comprising compressing said at least third and fourth conductive elements so that said remote surfaces of said at least two second conductive elements lie in a common plane.

4. The method as claimed in claim 1, wherein said substrate is flexible.

5. The method as claimed in claim 1, wherein said substrate comprises a dielectric material.

6. The method as claimed in claim 1, wherein said substrate comprises a polymeric material.

7. The method as claimed in claim 1, wherein said microelectronic element is electrically interconnected with said substrate.

8. The method as claimed in claim 1, wherein said microelectronic element is a semiconductor chip having a front face with contacts and a back face remote therefrom.

9. The method as claimed in claim 8, wherein the front face of said semiconductor chip faces said substrate.

10. The method as claimed in claim 8, wherein the front face of said semiconductor chip faces away from said substrate and the back face of said semiconductor chip faces said substrate.

11. The method as claimed in claim 1, wherein said microelectronic element is electrically interconnected with said substrate by conductive wiring.

12. The method as claimed in claim 1, further comprising a compliant layer disposed between said microelectronic element and said substrate.

13. The method as claimed in claim 1, wherein said at least two conductive elements are disposed over a top surface of said substrate.

14. The method as claimed in claim 1, wherein said at least two conductive elements are disposed over a bottom surface of said substrate.

15. The method as claimed in claim 1, wherein said substrate comprises a plurality of dielectric layers, and wherein a plurality of layers of conductive traces extend through said substrate.

16. The method as claimed in claim 1, wherein said microelectronic package is a first microelectronic package, further comprising making a second microelectronic package using the steps of claim 1, and stacking said second microelectronic package atop said first microelectronic package, wherein said first and second microelectronic packages are electrically interconnected together through said at least two conductive elements of each of said first and second microelectronic packages.

* * * * *